(12) United States Patent
Parthasarthy et al.

(10) Patent No.: US 7,525,470 B2
(45) Date of Patent: Apr. 28, 2009

(54) PHASE CONTROL FOR INTERLEAVED ANALOG-TO-DIGITAL CONVERSION FOR ELECTRONIC DISPERSION COMPENSATION

(75) Inventors: Vasudevan Parthasarthy, Irvine, CA (US); Sudeep Bhoja, San Jose, CA (US); Vivek Telang, Austin, TX (US); Afshin Momtaz, Laguna Hills, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 11/845,765

(22) Filed: Aug. 27, 2007

(65) Prior Publication Data
US 2008/0048897 A1 Feb. 28, 2008

Related U.S. Application Data

(60) Provisional application No. 60/840,123, filed on Aug. 25, 2006.

(51) Int. Cl.
*H03M 1/12* (2006.01)

(52) U.S. Cl. .................. 341/156; 341/118; 341/120; 341/145; 341/155

(58) Field of Classification Search ......... 341/118–122, 341/155, 156, 145
See application file for complete search history.

(56) References Cited

U.S. PATENT DOCUMENTS

| 5,684,431 | A | | 11/1997 | Gilbert et al. | |
|---|---|---|---|---|---|
| 5,870,042 | A | * | 2/1999 | Noda | 341/120 |
| 6,177,899 | B1 | * | 1/2001 | Hsu | 341/156 |
| 6,204,784 | B1 | * | 3/2001 | Hatfield | 341/118 |
| 6,466,629 | B1 | * | 10/2002 | Isaksson et al. | 375/316 |
| 6,522,282 | B1 | * | 2/2003 | Elbornsson | 341/155 |
| 6,570,410 | B2 | * | 5/2003 | Manganaro | 327/94 |
| 6,603,415 | B1 | * | 8/2003 | Somayajula | 341/118 |
| 6,653,966 | B1 | * | 11/2003 | van der Goes et al. | 341/156 |
| 6,707,868 | B1 | | 3/2004 | Camagna et al. | |
| 6,982,664 | B1 | * | 1/2006 | Nairn | 341/118 |

(Continued)

FOREIGN PATENT DOCUMENTS

EP 1006697 A2 7/2000

(Continued)

OTHER PUBLICATIONS

Adaptive Electronic Dispersion Compensator for Chromatic and Polarization-Mode Dispersions in Optical Communications Systems, Bell Labs, Lucent Technologies, USA, Apr. 1, 2004; EURASIP Journal on Applied Signal Processing 2005:10, 1584-1592; 2005 Hindlaw Publishing Corporation.

(Continued)

*Primary Examiner*—Linh V Nguyen
(74) *Attorney, Agent, or Firm*—Brake Hughes Bellermann LLP

(57) ABSTRACT

Embodiments include a system for performing dispersion compensation on an electromagnetic signal received over a communication channel, the electromagnetic signal bearing information at a symbol rate. An interleaved analog to digital converter ("ADC") block may be used, wherein the interleaved ADC block may be configured to generate a plurality of digitally sampled signals from the electromagnetic signal. An interleaved equalizer block may be configured to digitally process each of the digitally sampled signals generated by the ADC block to generate a plurality of digitally equalized signals. A multiplexer may be configured to aggregate the digitally equalized signals into a composite output signal.

18 Claims, 17 Drawing Sheets

U.S. PATENT DOCUMENTS

| | | | |
|---|---|---|---|
| 7,027,503 | B2 | 4/2006 | Smee et al. |
| 7,053,804 | B1* | 5/2006 | Nairn .......................... 341/118 |
| 7,148,828 | B2* | 12/2006 | Fernandez et al. .......... 341/120 |
| 7,233,270 | B2* | 6/2007 | Lin .............................. 341/118 |
| 7,292,101 | B2 | 11/2007 | Kocaman et al. |
| 7,324,038 | B2* | 1/2008 | van der Goes et al. ...... 341/156 |
| 7,355,476 | B2 | 4/2008 | Kasha et al. |
| 2002/0164966 | A1 | 11/2002 | Meehan et al. |
| 2003/0174783 | A1* | 9/2003 | Rahman et al. ............. 375/298 |
| 2005/0270212 | A1* | 12/2005 | Smith et al. ................. 341/155 |
| 2006/0067699 | A1 | 3/2006 | Chandrasekhar |
| 2007/0024484 | A1* | 2/2007 | Liu .............................. 341/156 |
| 2007/0133719 | A1* | 6/2007 | Agazzi et al. ............... 375/341 |
| 2008/0048896 | A1 | 2/2008 | Parthasarthy et al. |
| 2008/0049825 | A1 | 2/2008 | Chen et al. |
| 2008/0049847 | A1 | 2/2008 | Telang et al. |
| 2008/0069198 | A1 | 3/2008 | Bhoja et al. |
| 2008/0069199 | A1 | 3/2008 | Chen et al. |
| 2008/0187082 | A1 | 8/2008 | Bhoja et al. |
| 2008/0238542 | A1 | 10/2008 | Kocaman |
| 2008/0240325 | A1* | 10/2008 | Agazzi et al. ............... 375/371 |
| 2008/0258814 | A1 | 10/2008 | Kocaman et al. |
| 2008/0272952 | A1* | 11/2008 | Wood .......................... 341/166 |

FOREIGN PATENT DOCUMENTS

| | | |
|---|---|---|
| WO | 0213424 A2 | 2/2002 |
| WO | 02071616 A2 | 9/2002 |

OTHER PUBLICATIONS

Advanced Topics in Circuit Design: High-Speed Electrical Interfaces, EE209C-Spring 2004; Lecture 16: Components, Decision Feedback Equalizers, pp. 1-19, Mar. 11, 2004.

Adaptive Equalizer and Data Recovery in a Dual-Mode (PAM2/4) Serial Link Transceiver, Rambus, Inc., Los Altos CA 94022, USA; Department of Electrical Engineering, Stanford University, CA 94305, USA, pp. 1-4.

Stojanovic, Vladimir et al., "Adaptive Equalizer and Data Recovery in a Dual-Mode (PAM2/4) Serial Link Transceiver", Rambus, Inc., Los Altos CA 94022, USA; Department of Electrical Engineering, Stanford University, CA 94305, USA, (2004), pp. 1-4.

Notice of Allowance from U.S. Appl. No. 11/845,762 mailed Aug. 11, 2008.

Office Action Received for U.S. Appl. No. 11/731,481 mailed Aug. 20, 2008, 6 pages.

European Search report for U.S. Appl. No. 11/837,301 mailed Dec. 6, 2007.

European Search report for U.S. Appl. No. 11/837,278 mailed Dec. 6, 2007.

Koc, Ut-Va "Adaptive Electronic Dispersion Compensator for Chromatic and Polarization-Mode Dispersions in Optical Communications Systems", Bell Labs, Lucent Technologies, USA, Apr. 1, 2004; EURASIP Journal on Applied Signal Processing 2005: 10, 1584-1592; 2005 Hindlaw Publishing Corporation, (2005).

Nikolic, Borivoje "Advanced Topic in Circuit Design: High-Speed Electrical Interfaces", EE209C-Spring 2004; Lecture 16: Components, Decision Feedback Equalizers, (Mar. 11, 2004), pp. 1-19.

Mueller, Kurt H., "Timing Recovery in Digital Synchronous Data Receivers", IEEE Transactions on Communications, vol. Com-24, No. 5, (May 1976), pp. 516-531.

* cited by examiner

PHASE CONTROL FOR INTERLEAVED ANALOG-TO-DIGITAL CONVERSION FOR ELECTRONIC DISPERSION COMPENSATION

CROSS-REFERENCE TO RELATED APPLICATION

This application claims priority under 35 U.S.C. §119(e) to Provisional Patent Application 60/840,123, filed Aug. 25, 2006, and titled "DIGITAL ELECTRONIC DISPERSION COMPENSATION FOR MULTI-MODE FIBER," which is incorporated herein by reference in its entirety.

TECHNICAL FIELD

This description relates to digital integrated circuits and signal processing. In particular, this description relates to performing electronic dispersion compensation, employing an interleaved architecture and utilizing channel identification information for performing timing recovery.

BACKGROUND

A telecommunication system may include a transmitter for encoding information to be transmitted as an electromagnetic wave, a transmission medium which provides a conduit for the transmission of the electromagnetic wave and a receiver for receiving and processing the information bearing electromagnetic wave. A telecommunication system may utilize a waveguide as a transmission medium. A waveguide is a structure that guides or constrains the propagation of electromagnetic radiation. A waveguide may comprise a system of material boundaries in the form of a solid dielectric. In telecommunications, optical fibers are often utilized as waveguides.

It is desirable to increase the bandwidth or transmission rate of a telecommunication system for several reasons. First, greater bandwidth is required to support modern telecommunication applications such as that employed in data centers, or for live video and audio, multimedia and other bandwidth intensive applications. In addition, for efficiency and cost reasons it is desirable to increase the bandwidth of telecommunication systems. Therefore, it is important to address the physical limitations of waveguides for transmitting high bandwidth electromagnetic signals.

Dispersion is a significant physical phenomenon limiting the ability to successfully transmit and recover an information bearing electromagnetic wave over a communication channel. The phase velocity of any spectral component within a transmission medium will depend upon the index of refraction for the physical medium. Typically, the index of refraction of a transmission medium will be frequency dependent. Waveguide dispersion occurs when the speed of a wave in a waveguide such as optical fiber depends upon its frequency. The transverse modes for waves confined with a waveguide generally have different speeds depending upon the frequency. A similar phenomenon is modal dispersion caused by a waveguide having multiple modes at a given frequency, each of which propagates at a different speed.

Waveguide dispersion leads to signal degradation in telecommunication systems because the varying delay in arrival time between different components of a signal effectively degrades the pulse characteristic of pulses transmitted through the waveguide. This phenomenon is often referred to as intersymbol interference ("ISI"). Adjacent symbols represented as pulses effectively "run into" one another, and energy may exist at a particular sample instant of one symbol that actually includes energy associated with an adjacent symbol Thus, it is necessary to correct for error sources such as dispersion and associated ISI that may be introduced in a received signal transmitted over a communication channel. Typically, a receiver will be equipped with a signal processing system to correct for dispersion effects introduced by the communication channel. These signal processing systems often analyze statistical properties of the communication channel in order to cancel the ISI. The signal processing system typically utilizes one or more equalizers to perform these corrections. One type of equalizer often used is a feed forward equalizer ("FFE"), which attempts to correct for pre-cursor ISI (in which a current symbol is affected by a following symbol). Often an FFE may be combined with a decision feedback equalizer ("DFE"), which attempts to correct for post-cursor ISI (in which a current symbol is affected by a preceding symbol).

There are a number of technical challenges that may arise in building signal processing systems to correct for dispersion and ISI, which become particularly acute in communication systems employing a high baud rate or symbol rate. First, it is desirable to perform signal processing operations in the digital domain as it is often easier to achieve a higher SNR than an equivalent analog system. Second, digital systems offer the advantage of significantly lower complexity in signal layout and design and the opportunity to easily modify the signal processing routines employed.

A digital signal processing system necessitates a conversion of a received analog signal into a digital format. In general, it may be difficult and expensive to build a serial ADC to operate at baud rates in excess of 1.5-2 GHz. This is problematic because it is often desirable to build communication systems that operate around the order of at least 10 GHz. Similar issues exist for designing and building equalizers that may operate at high data rates.

A second technical issue relates to the time varying nature of communication channels, which impacts the performance of timing recovery operations at a receiver. A transmitter will typically include a clock, which is used to encode a data signal onto a carrier signal for transmission over the channel. The transmitter clock will determine the rate at which symbols are provided over the communication channel.

The receiver will typically also require a clock, which ideally should be phase locked to the transmitter clock in order to accurately recover the symbols transmitted by the transmitter over the communication channel. However, the transmitter and receiver clocks typically will experience a drift with respect to one another resulting in a frequency offset between the two. The phase being the integral of the frequency, will therefore suffer an offset between the transmitter and receiver clocks. Thus, receivers in communication systems typically include a timing recovery circuit to attempt to synchronize the transmitter clock with the receiver clock.

Digital communication systems may employ a method referred to as baud rate or symbol rate sampling, in which the received signal is sampled at the baud rate. Because the entire analog signal need not be recovered in a communication system, it is not necessary to sample at the Nyquist rate. However, baud rate sampling imposes significant constraints on the accuracy of the timing recovery operations performed at the receiver in order that the receiver samples a valid and stable signal.

As noted above, communication systems require a physical medium for the transmission of communication signals. The nature of the physical medium underlying the communication system may often be time varying. Typically this time dependence will be on a time scale relatively long compared with the baud rate. In the case where the communication channel may be approximated by its first order behavior, higher order effects are small, the channel characteristic is time invariant and initial conditions are known, the effect of the channel on a transmitted signal may be characterized by a impulse response or Green's function, which describes the response of the channel to an impulse signal. In conventional timing recovery systems utilizing conventional algorithms, the time varying nature of the channel characteristic may not be accounted for, reducing the ability of the signal processing system to perform accurate baud rate sampling and thereby effectively cancel the undesirable ISI effects.

SUMMARY

The details of one or more implementations are set forth in the accompanying drawings and the description below. Other features will be apparent from the description and drawings, and from the claims.

DETAILED DESCRIPTION

Figure 1:
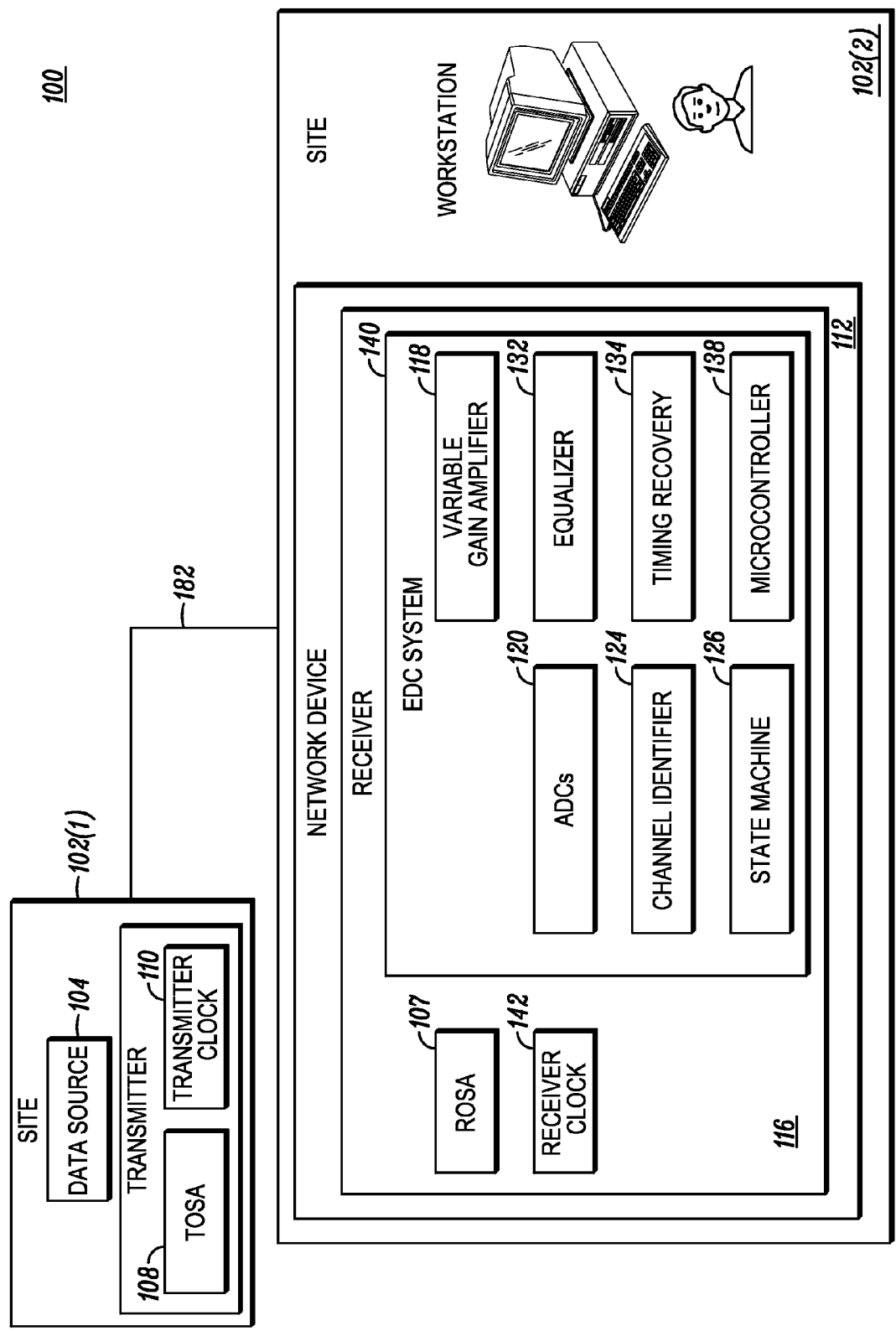
FIG. 1 is a block diagram of a telecommunication system.

FIG. 1 is a block diagram of a telecommunication system 100. The communication system 100 may include any number of sites 102 among which information may be exchanged over any number of communication channels 182. FIG. 1 illustrates two sites 102(1), 102(2), one of which includes a transmitter 108 and functions as a transmission site and the other includes a receiver 116 and functions as a receiver site. This is merely exemplary and it will be understood that a communication system may include any number of sites 102, each of which may provide solely transmission capabilities, solely receiver capabilities or a combination of both transmission and receiver capabilities.

The sites 102(1), 102(2) within the telecommunication system 100, may be, for example, data centers. Or, each site 102 may be a particular structure within a data center such as a data archival system or mass storage device (e.g., a disk storage array), a server or other front-end system. In a data center application, the access and transmission of large quantities of data at high data rates may be particularly important.

Each transmission site 102(1) may include a data source 104, which may be any system for archiving or generating data that is to be transmitted to a receiver site 102(2). Information to be transmitted between the transmission site 102(1) and the receiver site 102(2) may include any type of data such as multimedia information including audio and visual information, text information and may be stored in any appropriate format. The data source 104 may archive data for transmission from the transmission site 102(1) to the receiver site 102(2). Or, the data source 104 may provide real-time or near real-time data for transmission. For example, the data source 104 may be a multimedia device such as a video camera or microphone, which respectively generates video and audio signals. Or, the data source 104 may be an archived multimedia file such as an MPEG file. The data source 104 may include any combination analog and digital information. The data source 104 may include data stored in any type of format including raw data or compressed data.

The transmission site 102(1) may transmit information from the data source 104 to the receiver site 102(2) via the communication channel 182 using electromagnetic signals. The electromagnetic signals transmitted over the communication channel 182 may utilize optical wavelengths or other wavelengths necessary to achieve a desired symbol rate. Thus, the communication channel 182 may be, for example, a fiber optic cable or other physical medium suitable for the transmission of optical wavelength electromagnetic signals. According to one embodiment, the transmission channel 182 may be multi-mode fiber optic cable over which a bit rate of 10 gigabits-per-second ("gbps") is achieved between the transmission site 102(1) and the receiver site 102(2). In a more specific example embodiment, the bit rate may be 10.3125 gbps.

The transmission site 102 may also include a transmitter 108. The transmitter 108 may further include a TOSA 106 ("Transmitter Optical Sub Assembly"), which provides an interface to the optical physical layer (e.g., an optical communication channel). The TOSA 106 may include a laser. In particular, the TOSA 106 may modulate an electromagnetic carrier signal generated by a laser (not shown) using the information provided by the data source 104 and provide this modulated signal to the communication channel 182. As the transmission site 102(1) and receiver site 102(2) may exchange digital information, the TOSA 106 may perform digital modulation of an optical carrier signal. Thus, the TOSA 106 may provide a plurality of electromagnetic signals for transmission over the communication channel 182, which correspond to data provided by the data source 104.

In the case of digital communications between the transmission site 102(1) and the receiver site 102(2), the data source 104 may provide a plurality of numbers representing information to be transmitted between the transmission site 102(1) and the receiver site 116. These numbers may be represented in binary or base 2 as a stream of bits (0 or 1). For each bit to be transmitted, the transmitter 108 may generate a first pulse electromagnetic signal to represent a digital 1 and a second pulse electromagnetic signal to represent a digital 0.

The transmitter 108 may also be equipped with a transmit clock 110, which controls a symbol rate by which the transmitter 108 transmits information over the communication channel 182. According to one embodiment, the transmit clock 110 may operate at 10 Gbps.

The receiver site 102(2) may include a network device 112 coupled to the communication channel 182, which provides a system for receiving and processing a signal transmitted by the transmission site 102(1) over the communication channel 182. In particular, the network device 112 may include a receiver 116, which includes various functional blocks for receiving and processing signals transmitted by the transmission site 102(1) over the communication channel 182.

The receiver 116 may include a ROSA ("Receiver Optical Sub Assembly"). The ROSA may include a photoelectric diode (not shown) which converts a light signal into an electronic signal. In particular, the photoelectric diode may convert a light signal into a current. A transimpedance amplifier in the ROSA (not shown) may further convert the current into a voltage, which can be further processed. The receiver 116 may include a receiver clock 142 that is designed to operate at the same frequency as the transmitter clock 110. Typically, however, the receiver clock 142 will not be perfectly synchronized with the transmitter clock 110 (i.e., there will be a drift or phase offset), which must be corrected for by the receiver. In order to correct for drift between the transmitter clock 110 and receiver clock 142, the receiver 116 may include a timing recovery block 134.

The receiver 116 may further include a variable gain amplifier ("VGA"), analog to digital converters ("ADCs") 120, an equalizer block 132, a channel identifier block 124, a timing recovery block 134, a state machine 126 and a microcontroller 138. The overall operations of the receiver 116 may be controlled by a microcontroller 138, which may coordinate the interactions between various functional blocks on the receiver 116. The state machine 126 may control startup and convergence activities of the receiver. Further example aspects of the EDC system 140, including example operations of the components just mentioned, are provided in more detail, herein.

Figure 2A:
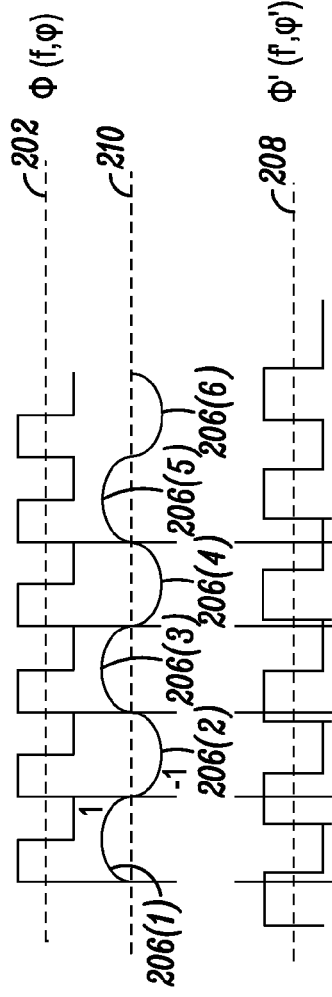
FIGS. 2a-2c are timing diagrams illustrating effects of dispersion on an electromagnetic signal transmitted over a communication channel.
Figure 2B:
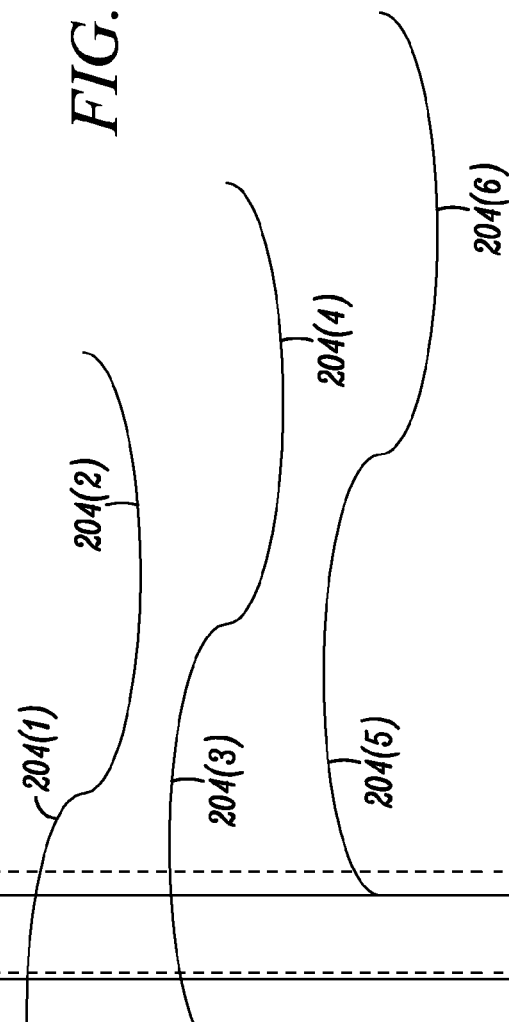
Figure 2C:

FIGS. 2a-2c illustrate the effects of dispersion on an electromagnetic signal transmitted over a communication channel on a physical medium such as, for example, a multi-mode fiber optic cable. FIG. 2a illustrates an idealized pulse train comprising a plurality of pulses 206(1)-206(6). Each pulse may be sequenced to a transmitter clock signal 202 characterized by a frequency and phase ($\phi(f, \phi)$). As shown in FIG. 2a, each pulse may correspond to a +1 or a −1 depending upon whether the pulse is positive or negative. Thus, pulses 206(1), 206(3) and 206(5) correspond to a +1, while pulse 206(2), 206(4) and 206(6) correspond to a −1. The +1/−1 pulses may respectively be translated to a 0 or 1 bit at a receiver.

In the ideal scenario shown in FIG. 2a, a receiver clock (not shown in FIGS. 2a-2c) that tracked the transmitter clock signal 202 perfectly in frequency and phase could be implemented at a receiver. In addition, under this ideal scenario, the pulse train 210 generated at a receiver could be transmitted without any signal distortion or degradation to a receiver. The receiver may utilize the receiver clock signal 208 to clock the sampling of a received signal from a transmitter. In particular, the receiver may perform baud rate sampling of the received signal in order to recover the bits encoded at the transmitter.

These ideal conditions, however, are not attainable in practice. FIG. 2b illustrates certain non-idealities that may occur in transmission of electromagnetic signals between a transmitter and a receiver. In particular, FIG. 2b shows a receiver clock signal 208 characterized by a frequency and phase $\phi'(f', \phi')$. The receiver clock signal 208 may have a phase offset, and a frequency offset with respect to the transmitter clock signal 210. This frequency and associated phase offset may occur due to drift between the two clocks.

A second condition limiting the operation of a digital communication system relates to non-idealities of the transmission medium itself including dispersion effects and associated intersymbol interference. FIG. 2b also shows pulse characteristics for a plurality of pulses that have been transmitted from a receiver through a communication channel such as a fiber optic cable. In particular, received pulses 204(1)-204(6) may correspond respectively to transmitted pulses 206(1)-206(6). Each of the transmitted pulses 206(1)-206(6) undergo dispersion due to the characteristics of the communication channel. In particular, the index of refraction of the communication channel may be frequency dependent, resulting in the propagation of various frequency components of each pulse at different velocities. In the case where the communication channel 182 is a multi-mode fiber, dispersion of transmitted pulses may occur. As shown in FIG. 2b, the received pulses 204(1)-204(6) may be spread or smeared in time.

FIG. 2c shows a composite signal of the linear superposition of the pulses 204(1)-204(6). This composite signal may represent the actual communication signal received by the receiver. The characteristic of the transmitted pulse train 210 communication signal received by a receiver. The identity of each individual pulse signal (e.g., 206(1)-206(6)) may be distorted due to this linear superposition. This phenomenon is commonly referred to as intersymbol interference ("ISI"). In order to recover the transmitted signal and/or perform effective baud rate sampling, the ISI introduced by a communication channel must be significantly minimized.

Figure 3A:
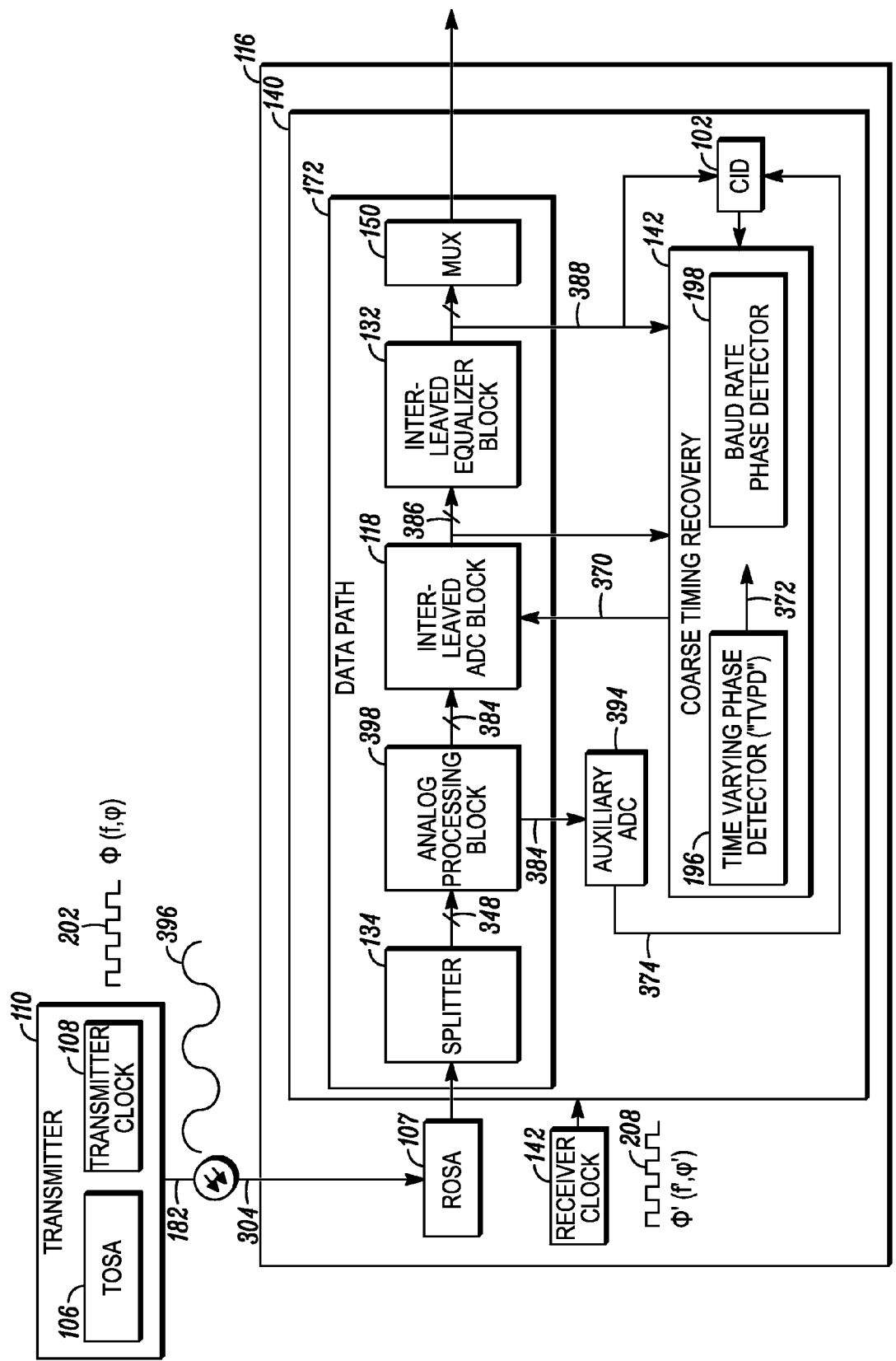
FIG. 3a is a block diagram of a signal processing system for correcting signal distortion in a signal received at a receiver in a communication system.

FIG. 3a is a block diagram of a signal processing system for correcting signal distortion such as waveguide dispersion and associated IS in a signal received at a receiver in a communication system. A pulse signal 206 is generated at a transmitter 108 encoding data at a baud rate as a function of a transmitter clock 110, which generates a transmitter clock signal 202. The pulse signal is provided to a communication channel via a TOSA 106 at the transmitter 108. The communication channel may be implemented using a multi-mode fiber optic cable.

A transmitter 108 may generate an information bearing signal 396 comprising a plurality of pluses synchronized to a transmitter clock 110, which generates a transmitter clock signal 202. The transmitter clock signal 202 may define a baud rate or symbol rate defining a number of distinct signal changes provided to the communication channel 182 per second. The transmitter clock may encode data at any baud rate. For example, according to one embodiment the baud rate is 10 Gbps.

A TOSA 106 at the transmitter 108 may cause the transmission of the information bearing signal 396 over a communication channel 182, which may be a multi-mode fiber optic communication channel. The information bearing signal 396 may undergo various transformations and/or distortions due to a channel characteristic of the communication channel 182. These distortions and transformations may cause the received signal 304 received at a ROSA 107 to be been significantly altered from the information bearing signal 396 generated at the transmitter 108. These distortions may include among other things ISI and dispersion. The channel characteristic may be characterized by an impulse response of the communication channel 182. These distortions may result in significant difficulties in recovering the information originally encoded in the information bearing signal 396.

The received signal 304 may be provided to a signal processing system 140 in order to compensate for the signal distortions introduced by the communication channel 182. In particular, the signal processing system 140 may perform signal conditioning on the received signal 304 to correct for distortions introduced by the communication channel 182. In general, the signal processing system 140 may perform processing on the received signal 304 in both the analog and digital domains. In order to perform digital processing, the signal processing system 140 may perform analog to digital conversion of a signal derived from the received signal 304 (described below).

Because the information bearing signal 396 may encode data at a high baud rate, the signal processing system 140 may include one or more interleaved structures that may individually operate at a clock rate lower than the baud rate. This may be useful to perform processing in the digital domain. Thus, as shown in FIG. 3a, the signal processing system 140 may include an interleaved ADC block 118 and an interleaved equalizer block 132. As described in more detail below, the interleaved ADC block 118 may include a plurality of ADCs, each operating at a lower clock rate than the baud rate. Similarly, the interleaved equalizer block 132 may include a plurality of equalizer structures each operating at a lower clock rate than the baud rate. The interleaved ADC block 118 and interleaved equalizer block 132 may operate at the same clock rate or different clock rates, with respect to one another.

The interleaved ADC block 118 may utilize baud rate sampling so that the combined operation of the plurality of ADCs comprising the interleaved ADC block 118 may effectively sample the received signal 396 at the baud rate. The receiver may include a receiver clock 142, which generates a receiver clock signal 208. Ideally the receiver clock 142 would be precisely locked with the transmitter clock 110 in frequency to allow for precision sampling of the received signal 396 at the baud rate. However, in practice the receiver clock 142 will typically drift in frequency with respect to the transmitter clock 110, resulting in a phase offset between the transmitter clock 110 and receiver clock 142. In order to compensate for this frequency drift, the signal processing system 140 may include a baud rate phase detector 198. The baud rate phase detector 198 may operate to recover timing information relating to the received signal 396. The timing information may be utilized to enforce the condition that each sampling instant at which the interleaved ADC samples the received signal 396 corresponds to a valid and stable symbol condition as it was encoded at the transmitter 108. The timing recovery operation performed by the baud rate phase detector 198 facilitates the use of baud rate sampling by the interleaved ADC block 118 and helps to ensure the samples obtained at the baud rate correspond to valid symbols. According to one embodiment, the baud rate phase detector 198 may utilize an algorithm derived from the Mueller-Muller algorithm. The receiver clock signal 208 may be utilized by the interleaved ADC block 118 to trigger a sampling operation.

As just noted, the baud rate phase detector 198 may perform a variant of the Mueller-Muller algorithm in order to perform timing recovery operations. In order to carry out this algorithm, the baud rate phase detector may assume that the communication channel 182 has a particular channel characteristic, which may be expressed as an impulse response for the communication channel 182. However, due to fluctuating physical conditions, the channel characteristic of the communication channel 182 may, in fact, vary in time. Typically, the time variation of the channel characteristic may vary at a rate significantly slower than the baud rate. For example, in the case of a multi-mode fiber, the time variation of the channel characteristic may occur as a result of a physical movement or vibration of the fiber, which may occur relatively infrequently with respect to the baud rate.

In order to account for the time varying nature of the channel characteristic, the signal processing system 140 may include a time varying phase detector ("TVPD") 196. The TVPD 196 may periodically determine a channel characteristic of the time varying communication channel 182. The channel characteristic may be an estimated impulse response of the communication channel 182. As described below, the TVPD 196, or related circuitry within the CID block 102, may compute the estimated impulse response of the communication channel 182 for each of a plurality of sampling phases. These plurality of sampling phases may then be used to provide estimates of the impulse response that are over sampled compared to the baud rate. The TVPD 196, or related circuitry within the CID block 102, may periodically compute an optimum phase among the plurality of phases using a metric. The TVPD 196, or related circuitry within the CID block 102, may then compute timing information data 372 which it may provide to a phase locked loop (PLL), (not shown in FIG. 3a) used to control a sampling operation of the interleaved ADC block 118.

Referring to FIG. 3a, the received signal 304 after being received by a ROSA 107 on the receiver 116 may be provided to a data path 172 comprising a splitter 134, an analog processing block, an interleaved ADC block 118, an interleaved equalizer block 133 and a multiplexer ("MUX") 150. The splitter 134 may split the received signal 304 into a parallel analog signal 348 comprising a plurality of analog signals. The parallel analog signal 348 may then be provide to an analog processing block 398. The analog processing block 398 may perform any signal conditioning on the parallel analog signal 348 generating a processed analog signal 384. The nature of the signal conditioning performed by the analog processing block 398 will be described in more detail below. In general, however, signal conditioning may include gain adjustment or analog filtering. The analog processing block 398 may then generate a processed analog signal 384, which may be provided to an interleaved ADC block 118. The interleaved ADC block 118 may effectively perform analog to digital conversion of the processed analog signal 384 at the baud rate. As described in more detail below, the interleaved ADC block 118 may comprise a plurality of ADCs, each operating at a lower clock rate than the baud rate such that the combined operation of the plurality of ADCs is to sample the processed analog signal 384 at the baud rate.

The interleaved ADC block 118 may output a digital signal 386, which may then be provided to an interleaved equalizer block 132. As described in more detail below the digital signal 386 provided by the interleaved ADC block 118 to the interleaved equalizer block 118 may comprise a plurality of digital signals each corresponding to a separate ADC on the interleaved ADC block 118. The interleaved equalizer block 132 may perform digital equalization on the digital signal 386. As described below, the equalization performed by the interleaved equalizer block 132 may correct for dispersion and ISI introduced by the communication channel 182. The interleaved equalizer block 132 may comprise any combination of a feed forward equalizer ("FFE"), decision feedback equalizer ("DFE") and sequence DFE as described below.

The interleaved equalizer block 132 may generate a decision signal 388, which may be provided to a multiplexer ("MUX") 150. The MUX 150 may generate a multiplexed output, as shown.

The decision signal 388 may also be provided to the TVPD 196. The processed analog signal 384 may be provided to an auxiliary ADC 394 which may sample the processed analog signal 384 and generate a digital signal 374 for processing by the TVPD 196 in conjunction with the decision signal 388. The auxiliary ADC 394 may operate at a sampling rate significantly lower than the baud rate. According to one embodiment, the auxiliary ADC may operate at 10 MHz.

As described below, the CID block 102 may compute the estimated impulse response of the communication channel 182 for each of a plurality of sampling phases, and may periodically compute an optimum phase among the plurality of phases using a metric. The TVPD 196 may thus determine a regenerated or reference waveform using the calculated optimum phase information, so that the timing recovery may be performed (e.g., by a PLL 804, as shown in FIG. 7b) based on an error calculation performed between this regenerated or reference waveform and the actual output 386 of the interleaved ADC block 118.

Figure 3B:
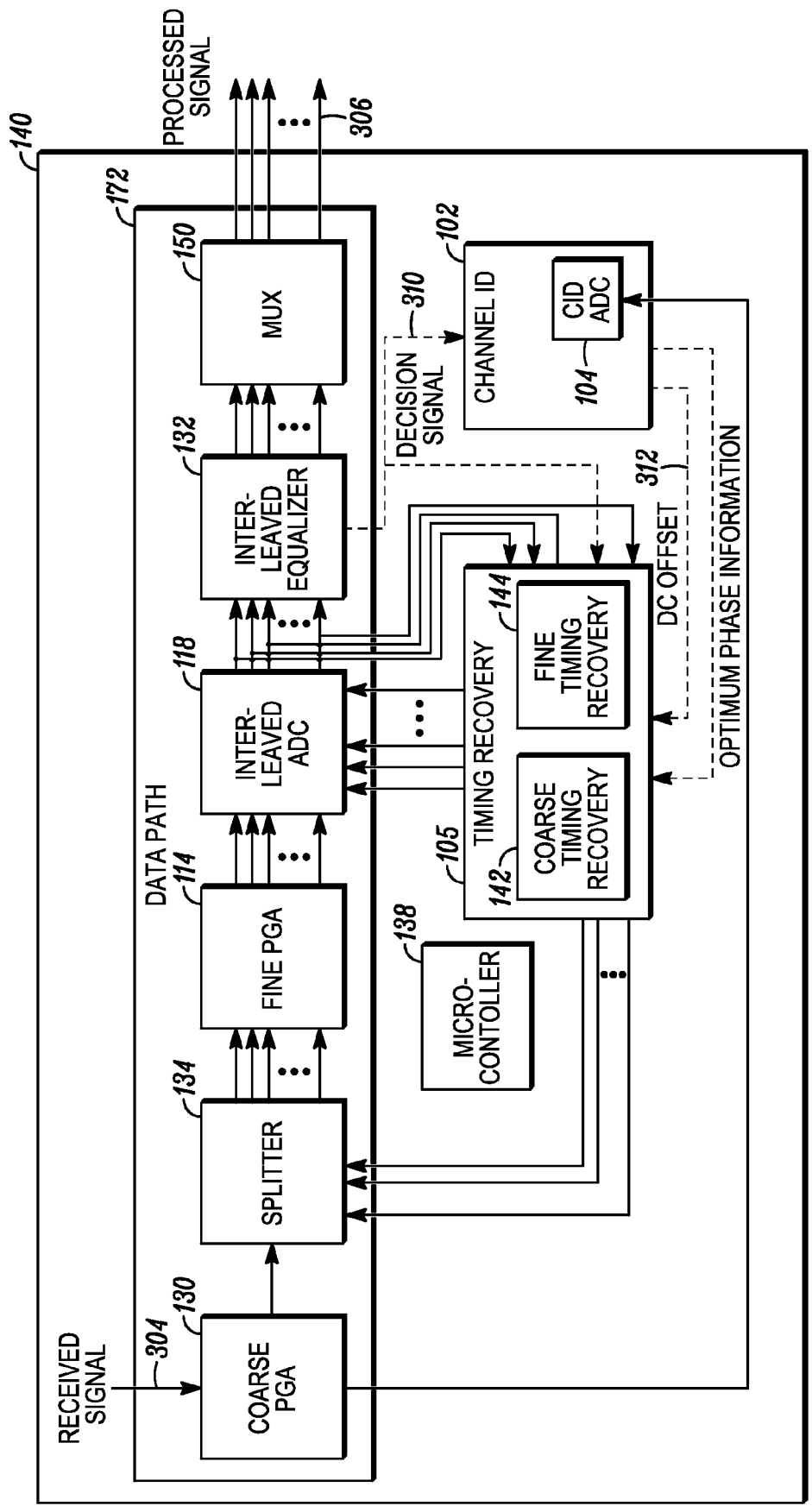
FIG. 3b depicts a detailed view of a signal processing system.

FIG. 3b depicts a more detailed view of the signal processing system 140. As shown in FIG. 1, the signal processing system 140 may include the microcontroller 138, which may orchestrate the operation and interoperation of the various components comprising the signal processing system 140. For example, the microcontroller 138 may trigger various functional blocks on the signal processing system 140 at various points in time.

In order to handle high data rates, the signal processing system 140 may utilize one or more interleaved components. An interleaved architecture may allow a particular component to operate at a clock rate lower than symbol rate. For example, to the extent that the signal processing system may perform a portion of the signal processing in the digital domain, the signal processing system 140 may include an interleaved analog to digital converter ("ADC") block 118. According to one embodiment, the signal processing system 140 may utilize baud rate sampling in which the received signal 304 is sampled at the symbol rate. Thus, for example, if the symbol rate is 10 Gbps, the signal processing system 140 may utilize an interleaved ADC block 118 employing a parallel array of ADCs (not shown in FIG. 3) each operating at a sampling rate of 1.25 Gbps to achieve the desired baud rate sampling of 10 Gbps. The bandwidth of each of the parallel array of ADCs may be set, for example, to approximately 5 GHz.

In addition, the signal processing system 140 may include an interleaved equalizer block 132 to correct for various signal distortions including dispersion and ISI. The interleaved equalizer block 132 and interleaved ADC 118 may both utilize the same or a different number of parallel substructures. For example, according to one embodiment, the interleaved ADC 118 includes eight parallel ADCs each operating at a sampling rate of approximately 1.25 GHz. The interleave equalizer block 132 may include a parallel array of 16 equalizer slices each operating at a clock rate of approximately 625 MHz. In general, the interleaved ADC block 118 and interleaved equalizer block 132 may each respectively utilize any number of parallel substructures and may individually operate at any suitable clock rate. Further, the above values are merely for the sake of example, and may be adjusted as needed, e.g., if an actual data rate varies from the 10 Gbps example (e.g., is 10.3125 Gbps or some other desired value).

The signal processing system 140 may also include a timing recovery block 105 to perform symbol synchronization or timing recovery. A receiver clock or clocks (not shown in FIG. 3) may be continuously adjusted in its frequency and phase to optimize the sampling instants of the received signal 304 and to compensate for frequency drifts between oscillators used in the transmitter clock and receiver clock circuits (not shown in FIG. 3). The timing recovery block 105 may provide timing information to the interleaved ADC block 118 in order to ensure that the interleaved ADC block 118 performs its sampling operations precisely. In particular, for example, if the signal processing system 140 performs baud rate sampling, the timing recovery block 105 causes the interleaved ADC block 118 to perform sampling at the symbol rate.

More specifically, the timing recovery block 105 may output timing information to the splitter 134, in order to cause the splitter 134 to split the incoming signal from the coarse PGA 130 into a number of signals that are appropriately spaced from one another (e.g., are 100 ps apart). Further, the timing recovery block 105 may output to the interleaved ADC block 118 by way of a plurality of interpolators, so that the interleaved ADCs may sample the baud in very fine steps (e.g., 1.5 ps with 100 ps baud interval and 64 phase interpolator). Additional details regarding example embodiments of the timing recovery block 105 are provided below, for example, with respect to FIG. 5a.

The timing recovery block 105 may include both a coarse timing recovery block 142 and a fine timing recovery block 138. The purpose of these two structures will be described in more detail below. However, in general the coarse timing recovery block 142 may control the best sampling rate for the channel while the fine timing recovery block 138 may correct for timing mismatches that may occur due to the presence of the plurality of ADCs in the interleaved ADC block 118, and/or due to the presence and operation of the splitter 134 in splitting the received amplified signal from the coarse PGA 130 into a plurality of signals corresponding to the number interleaved ADCs.

The signal processing system 140 may also include a channel identification ("channel ID") block 102, which may output to the TVPD 196 of FIG. 3a, as shown therein. The structure and function of the channel ID block 102 will be described in more detail below. However, in general, the channel ID block 102 may determine representations of the communication channel characteristic at various instants in time. The channel characteristic may include, for example, an impulse response of the communication channel. As shown in FIG. 3b, the channel ID block 102 may provide information to the timing recovery block 105 to allow more efficient and accurate timing recovery operation. In particular, as shown in FIG. 3b, the channel ID block 102 may provide a parameter referred to herein as a DC offset 312 to the timing recovery block 105.

A channel ID ADC 104 (analogous to, or associated with, the auxiliary ADC 394 of FIG. 3a) may be provided for the channel ID block 102 to sample an input signal provided to the channel ID 102. As the channel ID 102 functions to determine a channel characteristic, which may be changing at a significantly lower rate than the symbol rate, the channel ID ADC 14 may operate at a different sampling rate than that of the ADCs comprising the interleaved ADC II 8. According to one embodiment, the channel ID 104 operates at a sampling rate of 10 MHz.

As described in more detail below, the channel ID 102 may construct representations of the channel characteristic at any number of different phases. Representations for each phase may be stored at the channel ID block 102 and periodically a best phase may be determined. According to one embodiment a best representation of the channel is chosen that maximizes signal energy after accounting for dispersion and ISI.

A data path for the signal processing system 140 will now be described. A received analog signal 304 may first be received by a coarse programmable gain amplifier ("PGA") block 130. The PGA may be a variable gain amplifier. The coarse PGA block 130 may perform amplification on the received signal 304 to achieve a desired uniform amplitude level for the received signal 304. A digital control circuit (not shown in FIG. 3) may receive one or more numerical values, which are used to control the overall gain of the coarse PGA circuit 130. The PGA circuit 130 may utilize any combination of passive and active circuit elements to achieve gain correction.

The received signal 304 having been processed by the PGA block 130 may then be provided to a splitter 134, which generates an appropriate number of replicas of the signal received from the PGA block 130. The splitter 134 may function to prepare the requisite number of inputs for the interleaved ADC block 118. For example, according to one embodiment, the interleaved ADC block 118 includes eight parallel ADCs. In this case, the splitter generates eight replicas of the signal received from the PGA block 130. The set of signals generated by the splitter 134 may not be of uniform amplitude due to component mismatch in the splitter 134 circuitry. In order to correct for this non-uniformity, each of the signals generated by the splitter 134 may be passed to a fine PGA block 114. The fine PGA block 114 may include a plurality of fine PGAs (not shown in FIG. 3) each respectively providing individual amplitude amplification for each of the signals generated by the splitter 134.

The collection of parallel signals may then be passed to an interleaved ADC block 118. In particular, each of the fine PGAs comprising the fine PGA block 114 may pass its respective signal to an individual ADC within the interleaved ADC block 118. The interleaved ADC block 118 may perform baud rate sampling utilizing the set of received signals from the fine PGA 114. The structure and function of the interleaved ADC block 118 will be discussed in further detail below. In general, the ADC block 118 may comprise a plurality of ADCs, each operating at a sampling rate that may be significantly lower than the overall symbol rate of the telecommunications system. For example, according to one embodiment the symbol rate of the channel may be 10 Gbps and the interleaved ADC 118 includes 8 parallel ADCs each operating at a sampling rate of 1.25 Gbps.

As referenced above, and as described in more detail below, the CID block 102 may use the decision signal 310 and the output of the CID ADC 104 to determine information about an optimum phase information related to the communication channel. Then, the TVPD 196, e.g., within the coarse timing recovery block 142, may provide a regenerated or reference waveform, based on the optimum phase information, and the coarse timing recovery block 142 may compare the reference waveform to the actual output of the interleaved ADC block 118 to determine error information therebetween that may then be used to assist in performing timing recovery, e.g., by outputting a phase signal that may be used by a phase-locked loop (in a conventional manner) to instruct the sampling of the amplified received signal at the splitter 134 and at the interleaved ADC's 118.

Figure 4:
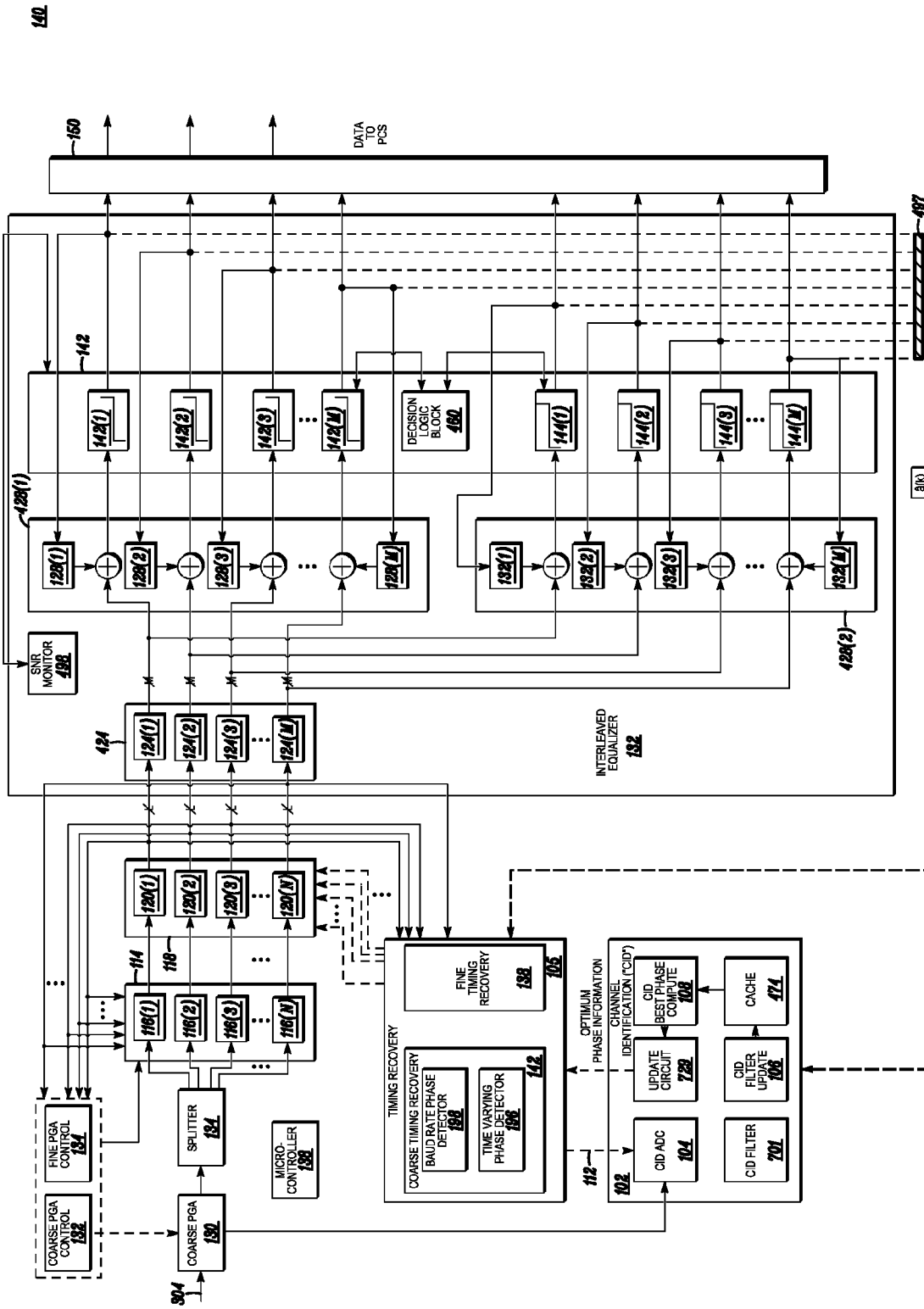
FIG. 4 further depicts a signal flow through a signal processing system for correcting for signal distortions introduced by a communication channel.

FIG. 4 further depicts a signal flow through a signal processing system for correcting for signal distortions introduced by a communication channel. A received signal 304 is provided to a coarse programmable gain amplifier ("PGA") 130. The coarse PGA 130 provides overall gain adjustment for the received signal 304. The output of the coarse PGA 130 may then be provided to a splitter circuit 134. The splitter circuit 134 may generate a plurality of copies (N) of the gain adjusted signal, which are each respectively provided to a fine PGA block 114. In particular, each of the outputs of the splitter block 134 is respectively provided to a parallel fine PGA circuit 116(1)-116(N). Each of the parallel fine PGA circuits 116(1)-116(N) may perform independent gain adjustment on the received signal 304, at the instruction of a digital control circuit such as the fine PGA control 134. The parallel fine PGA circuits 116(1)-116(N) may allow for gain adjustments that may be necessary to correct for non-uniform signal levels in the interleaved structures comprising the signal processing system 140.

Each parallel fine PGA circuit 116(1)-116(N) may provide an output to a respective ADC 120(1)-120(N) comprising an interleaved ADC 118. Each ADC 120(1)-120(N) may convert a respective analog signal provided by a corresponding fine PGA circuit 120(1)-120(N) into a digital signal. The structure and function of an interleaved ADC 118 will be described in detail below. However, in general, each ADC 120(1)-120(N) may sample an incoming signal from the fine PGA block 14 at a clock rate lower than the baud rate such that the effective sampling rate of the combined ADCs 120(1)-120(N) is the baud rate. This may be achieved, as described below, by introducing a phase offset for each ADC 120(1)-120(N) with respect to one another. For example, according to one embodiment, the baud rate is 10 Gbps while the interleaved ADC block 118 comprises 8 ADCs each operating at a sampling rate of 1.25 Gbps yielding an effective sampling rate of 10 Gbps. Each ADC 120(1)-120(N) may also operate at a particular bit resolution. According to one embodiment, each ADC 120(1)-120(N) provides 6 bit resolution.

The outputs of the interleaved ADC block 118 may be provided to an interleaved equalizer block 132 comprising an interleaved FFE 424, interleaved parallel decision feedback equalizer blocks 428(1), 428(2) and sequence DFE block 142. The interleaved FFE block 424 may perform signal processing operations to correct for precursor ISI. The interleaved FFE block 424 may include a plurality of FFE cells 124(1)-124(M). The number of FFE cells (M) may correspond to or may be different from the number of parallel ADCs 120(1)-120(N). Thus, each interleaved FFE cell 124(1)-124(M) may operate at a different clock rate than the clock rate of each ADC 120(1)-120(N). A buffer circuit (not shown in FIG. 4) may function to allow negotiation of the N outputs of the interleaved ADC block 118 (120(1)-120(N)) to be provided to M inputs of the interleaved FFE block 424 (124(1)-124(M)). According to one embodiment, the interleaved FFE block 424 comprises 16 FFE cells 124(1)-124(M) each operating at a clock rate of 625 MHz. The structure and function of each of the FFE cells 124(1)-124(M) will be described in detail below.

The interleaved PDFE blocks 428(1) and 428(2) may operate to correct for postcursor ISI. Each PDFE block 428(1) and 428(2) may include a plurality of summation blocks that respectively compute a summation of an output signal from a respective interleaved FFE cell 124(1)-124(M), and an output from a PDFE cell 128(1)-128(M) and 132(1)-132(M).

The output of each summing block may be provided to a respective slicer 142(1)-142(M), 144(1)-144(M) in the sequence DFE block 144. Each slicer 142(1)-142(M), 144(1)-144(M) may receive an input signal from a respective PDFE cell 128(1)-128(M), 132(1)-132(M), compare the input signal with a threshold value and output a decision signal â(k) indicating whether the signal value falls below or above the threshold value. According to one embodiment each decision signal â(k) may be a one bit signal representing +1 or −1 value. Each decision signal â(k) may be routed back to a respective PDFE cell 128(1)-128(M), 132(1)-132(M). Each PDFE cell 128(1)-128(M), 132(1)-132(M) may receive a decision signal â(k) from a respective slicer 142(1)-142(M), 144(1)-144(M) and output a value to a respective summing block. According to one embodiment, the output value of each PDFE cell 128(1)-128(M), 132(1)-132(M) may be a 16 bit value.

A decision logic block 480 in the sequence DFE block 142 may select a current valid PDFE from one of the PDFEs 428(1) and 428(2) as providing valid and correct data. More specifically, for example, when an output(s) of the FFE 424 falls within an uncertainty range, then the interleaved PDFE 428(1) and 428(2) may be forced to different values (e.g., 1 and −1), and the decision logic block may accumulate an error measurement for each PDFE 428(1), 428(2) over a number of following (e.g., sequentially following) bit periods, and then select the PDFE having the lower error over that number of bit periods.

Any number of the plurality of decision signals from each slicer for the current valid PDFE (i.e., either 142(1)-142(M) or 144(1)-144(M)) may be routed to a CID block 102 and/or a timing recovery block 105. As noted with respect to FIG. 3b, the CID block 102 may provide optimum phase information for a TVPD functionality and the timing recovery block 105 also may provide baud rate phase detector functionality.

The CID block may include a CID ADC 104, which may sample the received signal 304 (after processing by the coarse PGA 130). Because the channel characteristic may be changing at a relatively low rate with respect to the baud rate, the CID ADC 104 may operate at a much lower clock rate than the baud rate. According to one embodiment, for example, the CID ADC 104 may operate at 10 MHz. Because the CID block 102 may operate at a significantly lower rate than the baud rate, according to one embodiment, only a subset of the decision signals â(k) may be routed to the CID block 102 and timing recovery block 105. This may be accomplished using a multiplexer or buffer 497, which may select one or more decision signals â(k) to route to the CID block 102 and/or timing recovery block 105.

The CID block 102 may also include a CID filter update block 106, a CID filter 701, an update circuit 729, a cache 474 and a CID best phase compute block 108. The CID filter update block 106 may receive a subset of decision signals â(k) from the current valid PDFE and based upon this information as well as the sampled received signal 304, the CID filter 701 may be used to update a current channel characteristic for the channel parameterized by a phase, as described in detail with respect to FIGS. 7a and 7b, below. Generally, as noted above, the CID block 102 may compute a channel characteristic for a plurality of phases. According to one embodiment, the CID block computes a channel characteristic for 16 different phases. The timing recovery block 105 may send a CID phase update signal 112 to the CID ADC 104 to control the sampling phase for the plurality of channel characteristic phase computations. According to one embodiment, the CID phase update signal 112 may be updated periodically to cause the CID block to begin generating a channel characteristic for a new phase.

The channel characteristics for the various phases may be cached at the CID block 102 using a cache 474. A CID best phase compute block 108 may periodically compute a best phase among the plurality of different channel characteristics that have been stored at the cache 474 and provide this channel characteristic to an update circuit 729 (described in more detail below, with respect to FIG. 7c), which may thus provide the optimum phase information associated with the channel characteristic to the TVPD block 196. The TVPD block 196 may perform a TVPD operation utilizing a channel characteristic provided by the CID best phase compute block 108. The TVPD block 196 also may receive a plurality of decision signals 310 from which (together with the optimum phase information/channel characteristic) it may generate a reference waveform (e.g., using reference waveform generator 703 of FIG. 7b) to be compared to an output of the interleaved ADCs 118, to thus obtain error information therebetween for determining a phase signal for instructing a PLL (e.g., the PLL 804 of FIG. 7b).

The fine timing recovery block 138 may receive the outputs of the interleaved ADCs 120(1)-120(N). Due to process variations the plurality of ADCs 120(1)-120(N), as well as circuitry related to driving the ADCs and/or the splitter 134, may encounter timing discrepancies. Based upon the inputs provide from the interleaved ADCS 120(1)-120(N), the fine timing recovery may provide a plurality of output signals to correct for timing variations for the ADCs 120(1)-20(N).

Finally in FIG. 4, a signal-to-noise (SNR) monitor 498 is illustrated that represents any suitable technique for detecting performance levels or characteristics of the EDC system 140. For example, the EDC system 140 may be required to maintain certain levels of bit error rate or other performance characteristic in order to stay in a stead-state operational mode, and if some error threshold is breached, then the EDC system 140 may be returned to a start-up state for recalibration of various settings of the EDC system, as described in more detail herein, e.g., with respect to the start-up state machine 126 and with respect to FIG. 11.

Although FIG. 4 shows particular functional operations as being associated with particular structures, this is merely exemplary and it will be understood by skilled practitioners that the organization and execution of particular operations or functions may be carried out by any combination of structures in FIG. 4. For example, although FIG. 4 shows a TVPD as being associated with a the timing recovery block 105, the TVPD operation or some portion of it may in fact be carried out at the CID block 102.

Figure 5A:
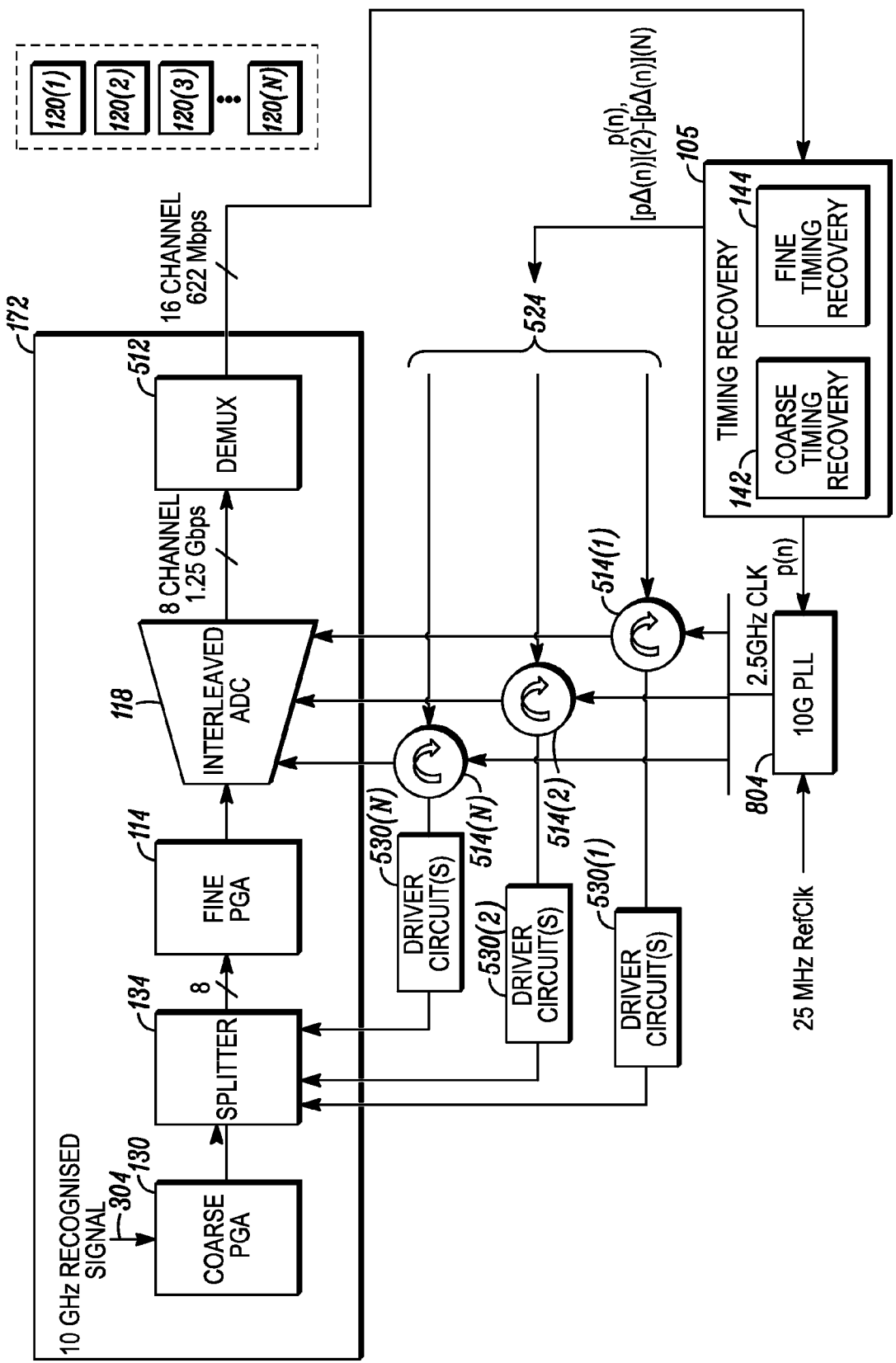
FIG. 5a depicts an example operation of an interleaved ADC according to one embodiment.

FIG. 5a depicts an operation of an interleaved ADC according to one embodiment. As noted with respect to FIGS. 3a, 3b and 4, an interleaved ADC may be provided in a data path 172 for correcting for waveguide dispersion and ISI. The data path may include among other components a coarse PGA 130, a splitter 134, a fine PGA 114 an interleaved ADC 118 and a DEMUX circuit 512.

The interleaved ADC 118 may operate to achieve an effective sampling rate commensurate with the baud rate or symbol rate of a received signal 304. For example, according to one embodiment the baud rate of the received signal 304 may be 10 Gbps. As noted with respect to FIG. 4, the interleaved ADC 118 may include a plurality of ADCs 120(1)-120(n). Each ADC 120(1)-120(n) may be driven by a common sampling clock signal, which may be adjusted by a timing recovery block 105 to correct for clock drift between the receiver and transmitter clocks, so that each ADC 120(1)-120(N) effectively has its own sampling clock.

In particular, the timing recovery block 105 may generate a phase signal p(n), as described below with respect to FIGS. 7a-7c, which may be provided to a PLL 804. The PLL 804 may generate an output signal for controlling a sampling phase of the plurality of ADCs 120(1)-120(n). According to one embodiment, the PLL 804 controls a single clock phase, which according to one embodiment may operate at 2.5 GHz. The single clock may be split into two 1.25 GHz clock signals, at least one of which may be replicated via a plurality of phase interpolators 514(1)-514(n). For example, each phase interpolator may generate one or more interpolated version(s) of the single clock signal and may respectively control operations of a particular ADC 120(1)-120(n). Further, as shown, each phase interpolator 514(1)-514(n) may control a corresponding circuit (e.g., a sample-and-hold circuit, as in the example of FIG. 5b) within the splitter 134. Between each phase interpolator 514(1)-514(n) and the splitter 134, corresponding driver circuit(s) 530(1)-530(n) may be used to drive or otherwise operate (corresponding circuits of) the splitter 134.

For example, the driver circuits may include buffering, amplifying, or timing circuits (e.g., clocks) that are used by the splitter 134 and/or the ADCs 120(1)-120(n). Further, as the splitter 134 may involve digital circuits, the driver circuits may include analog-to-digital converters. Still further, there may be relatively lengthy signal path on the chip between the interpolators 514(1)-514(n) and the splitter 134 and/the ADCs 118. Further specific examples of the driver circuits 530(1)-530(n) are provided below with respect to FIG. 5b and the illustrated sample-and-hold circuits 522(1)-522(n). In general, though, it may be appreciated that the referenced factors, and other factors, may lead to non-idealities in the operation of the splitter 134, and, thus, of the interleaved ADCs 120(1)-120(n).

For example, as described herein, it may occur that the timing recovery block 105 may seek to cause the interleaved ADC 118 to sample the incoming analog signal at intervals of 100 ps, in order to achieve a composite sampling rate of at least 10 GBps. More specifically, a first ADC 120(1) may be designed to perform a first sampling, and a second ADC 120(2) may be designed to perform a second sampling, 100 ps later in time. As described, the timing and spacing of the 100 ps sampling intervals may be designed so that the interleaved ADC 118 samples the input analog signal at an optimum (e.g., highest) point, so as, for example, to minimize an effect of ISI on the sampling operations.

In practice, however, the driver circuits 530(1)-530(n) may be mismatched with respect to one another. For example, the various components making up the driver circuits 530(1)-530(n) may be subject to various temperature or process variations during a fabrication thereof. Moreover, a length of a signal path of one driver circuit may be slightly different than that of another driver circuit, so that signals from the corresponding phase interpolators may take a relatively longer or shorter time to arrive at the splitter 134. As a consequence, the desired 100 ps intervals may be disrupted, so that, without correction, the splitter 134 may sample the incoming analog signal at some undesired interval(s), e.g., 90 ps or 110 ps.

Thus, a fine timing recovery block 138 in the timing recovery block 105 may be used to individually adjust each phase interpolator 514(1)-514(n) to account for such timing variations that may be related to these non-idealities, so that the interleaved ADCs 118 operate, for practical purposes, as a single ADC at the baud rate. For example, in one implementation, the phase interpolators 514(1)-514(n) may effectively divide the 1.25 GHz clock signal(s) from the PLL 804 into 512 phases (i.e., 512 copies of the 1.25 GHz clock, each separated in time by $\frac{1}{512}$ of a cycle), and then (for 8 ADCs 120(1)-120(8)), each phase interpolator 514(1)-514(n) may output a corresponding clock signal(s) spaced ⅛ of a cycle (e.g., here, 64 phases) apart from one another (e.g., at phase 0, phase 64, phase 128 ... phase 448), which may be forwarded to the splitter 134 by way of the driver circuits 530(1)-530(n). In this example, the desired 100 ps intervals may initially be achieved at the outputs of the phase interpolators 514(1)-514(8).

As just explained however, a result of generating these clock signals at 100 ps intervals may not actually correspond to sampling at the 100 ps intervals, due to the intervening driver circuits 530(1)-530(n). For example, the (in this example) 8 clocks may be delayed relative to one another so that the splitter 134 actually samples at some other interval besides 100 ps. Thus, the fine timing recovery block 138 may receive a digital output of the interleaved ADC 118 (e.g., from the DEMUX 512, described in more detail herein). Then, the fine timing recovery block 138 may digitally compute an effect(s) of the offsets from each of the driver circuit(s) 530(1)-530(n), and may cause a composite output timing recovery signal to be output to each of the phase interpolators 514(1)-514(n).

For example, a first phase interpoloator/ADC pair may be selected as a reference, and the remaining phase interpolator/ADC pairs may be adjusted relative to this reference pair. Thus, a first phase interpolator/ADC pair 514(1)/120(1) may operate based on p(n), while each phase interpolator/ADC pair other than the reference pair may operate based on a corresponding difference or delta between p(n) and a phase necessary to maintain relative timing of each pair, i.e., $[p\Delta(n)](2) - [p\Delta(n)](N)$. In other examples, a reference value may be selected as an average phase value, and all of the phase interpolators may be adjusted with respect thereto.

Figure 5B:
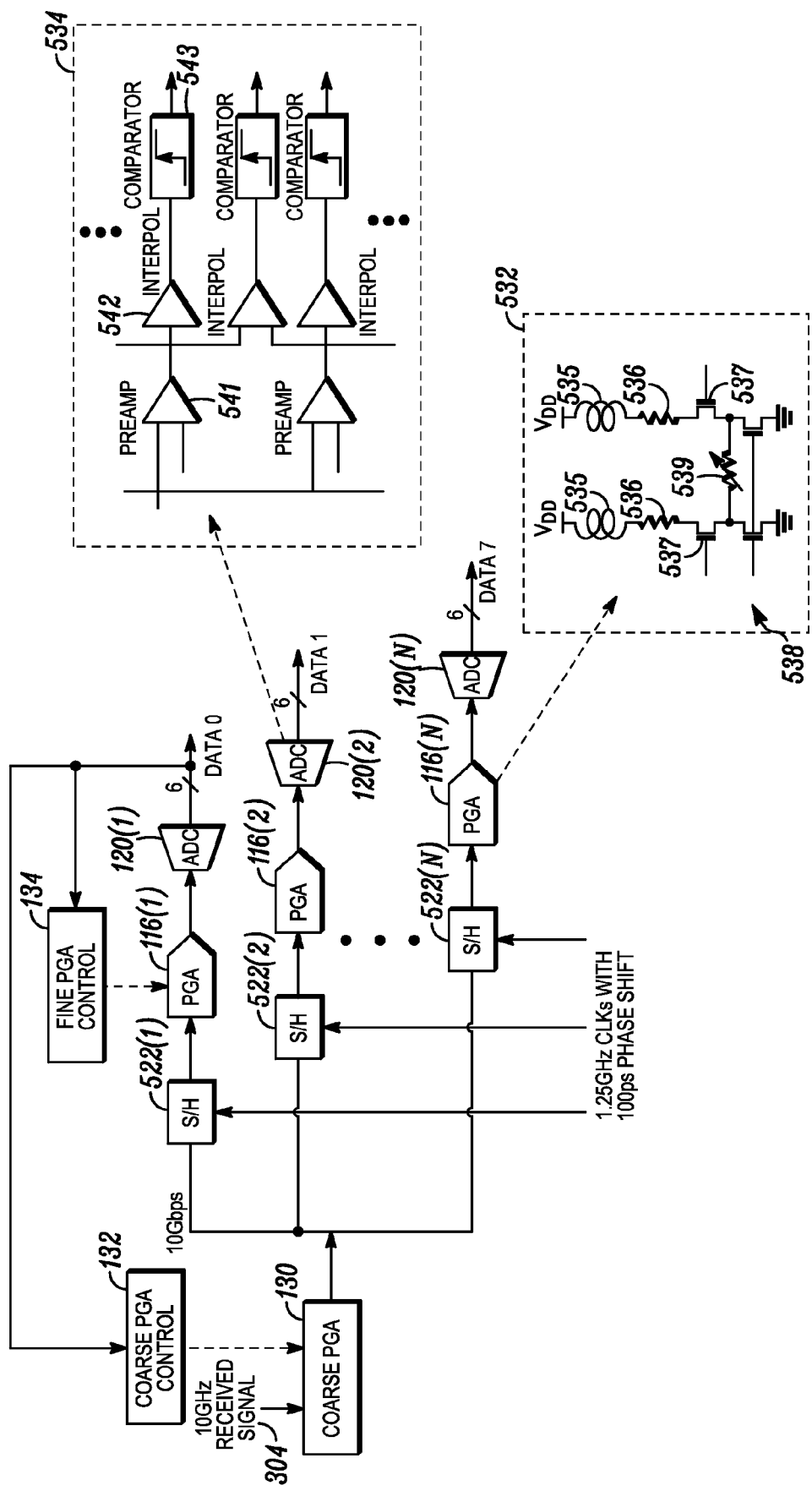
FIG. 5b shows a more detailed view of an ADC architecture according to one embodiment.

Thus, it may be appreciated that the timing recovery block 104 of FIG. 5a may generate a number (e.g., 8) of composite timing recovery signals, where, for example, each composite timing recovery signal is associated with a particular set of ADC-related circuits, i.e., a particular phase interpolator 514(1), driver circuit(s) 530(1), sample-and-hold circuit 522(1) of the splitter 134 (as shown in FIG. 5b), and ADC 120(1). Each composite timing recovery signal includes a coarse timing recovery signal from the coarse timing recovery block 142 (which is calculated as described herein, e.g., with respect to FIGS. 7a-8) combined with a fine timing recovery signal that is determined for the particular set of ADC-related circuits in question. Consequently, the input analog signal may be sampled at desired intervals (e.g., 100 ps), even in the presence of process non-idealities (such as in the construction and layout of the driver circuit(s) 530(1)-530(n). Because the fine timing recovery signal is calculated in the digital realm, the composite signals may be calculated accurately and with high efficiency and repeatability, and can be adjusted as needed to sample at desired intervals. Moreover, since the timing mismatches imparted by the driver circuit(s) 530(1)-530(n) may generally be static or time-invariant, the fine timing recovery block 138 may be configured to determine and store a timing offset for each individual ADC 120(n) and corresponding ADC-related circuitry, and may simply use these values in conjunction with the time-varying coarse timing recovery signal to generate the various composite timing recovery signals.

In other implementations, an additional phase interpolator (not shown in FIG. 5a) may be used to set the coarse timing recovery signal, e.g., may be placed between the PLL 804 and the phase interpolators 514(1)-514(n). Then, a common clock may be output from this coarse TR phase interpolator and sent to each of the phase interpolators 514(1)-514(n), acting here as fine TR phase interpolators, which would each then receive a corresponding fine timing recovery signal from the fine timing recovery block 138 to adjust the coarse/common clock signal accordingly to achieve the desired effect of common, discrete sampling intervals (e.g., 100 ps). Other implementations are also possible.

Thus, as referenced above, the fine timing recovery circuit 138 may be used to adjust timing information provided to the phase interpolators, so that a desired sampling interval (e.g., 100 ps) are maintained despite the presence of relative non-idealities in the various driver circuits 530(1)-530(N) (e.g., due to temperature, process, or other mismatches in the design and fabrication thereof).

FIG. 5b shows a more detailed view of an ADC architecture according to one embodiment. In FIG. 5b, as referenced above, the splitter 134 is shown to include a plurality of sample and hold circuits 522(1) to 522(N), which receive an input analog signal from the coarse PGA 130 and which individually drive fine PGAs 116(1)-116(N), as shown. Circuit 532 provides an example of a gain circuit in which a variable resistance is used to vary the overall gain of the PGA 116(N). Meanwhile, a circuit 534 provides an example of an ADC circuit using a flash ADC. Circuits 532 and 534 are merely examples, and other suitable circuits may be used, as well.

In the specific example of FIG. 5b, the circuit 532 for the fine PGA 116(N) includes inductors 535 connected to load resistors 536 and a pair of transistors 537 which provide a differential pair of transistors for setting the gain of the circuit 532. More specifically, with transistors 538 acting as a current source for the circuit 532, a variable resistor 539 may be implemented as a bank of parallel transistors, which receive digital code from the fine PGA controller 134 that determines how many of the bank of transistors should be activated to achieve a desired gain for an associated fine PGA 116(N). More specifically, the gain of the circuit 532 may generally be characterized as a ratio of the load resistance to a current value of the variable resistance 539. By activating more of the bank of parallel transistors, an overall resistance of the variable resistance 539 is decreased, so that the ratio of the load resistance thereto (and thus of the gain) is increased.

In the illustrated example, and as described herein, the ADC circuit 534 may present a large capacitive load (due, for example, to preamplifiers, comparators, or other circuit elements having a large capacitive load). This capacitive load is associated with a low available bandwidth for the ADC circuit 534, which may be compensated for with increased power. However, by including inductors 535 at an output of the fine PGA(s) 116(1)-116(N), an effect of the capacitive load may be minimized, and the available bandwidth may advantageously be increased, without a commensurate increase in power.

The ADC circuit 534 is an example of a flash ADC. In FIG. 5b, the flash ADC is implemented using preamplifiers 541, interpolators 542, and comparators 543. As the general operation of a flash ADC is known (e.g., here, a 6-bit flash ADC having 63 preamplifiers and 63 comparators), the general operation of circuit 534 is not described here in detail. However it may be appreciated that the interpolators 542 may allow the use of a reduced number of the pre-amplifiers 541 and comparators 543, e.g., where the interpolators 542 provide one-to-two interpolation, only 32 preamplifiers 541 and comparators 543 may be needed, in order to save power relative to a conventional operation.

As shown in FIG. 5b, and understood from FIG. 5a, the sample-and-hold circuits 522(1)-522(N) are designed to receive 1.25 GHz clock signals to thereby sample the incoming signal at 100 ps intervals. For example, the sample-and-hold block 522(1) may include a switch and a capacitor (not shown), so that when the switch is closed the capacitor may charge during a tracking mode, and when the switch is open the capacitor may store the charge during a hold mode, thus forming a track-and-hold circuit. By placing two such track-and-hold circuits back-to-back, the sample-and-hold 522(1) may be configured to sample at a defined point in time and to provide the sampled data to the fine PGA 116(1).

In the above configuration, each sample-and-hold block 522(1)-522(N) may use two clocks with opposite polarity that also are non-overlapping. To generate these clocks, a corresponding block may be included as part of each of the driver circuits 530(1)-530(n). These clocks also need to be appropriately amplified and buffered to be able to drive the required load(s) of the sample-and-hold blocks 522(1)-522(n), so that corresponding amplifiers and buffers may be included in the driver circuits 530(1)-530(N). Moreover, the sample-and-hold circuits 522(1)-522(n) and the ADCs 120(1)-120(N) may be located relatively far from the phase interpolators 514(1)-514(N), so that the phase interpolators need to drive a long interconnect(s), as well, where such long interconnect(s) may vary (relative to one another) between the different sample-and-hold blocks 522(1)-522(N) and the corresponding phase interpolators 514(1)-514(N). In addition, the phase interpolators 514(1)-514(N) may be implemented as analog blocks, while the sample-and-hold clock(s) is a digital (full swing) signal, so that an analog to digital (1 bit) converter is also needed within each of the driver circuits 530(1)-530(N).

As referenced above, with respect to FIG. 5a, some or all of the just-referenced components may be placed in all (e.g., 8) paths. As described, even if ostensibly-identical blocks are used in each path, random process mismatch can cause phase differences between the clocks supplied to the sample-and-hold blocks 522(1)-522(N). As described with regard to FIG. 5a, the timing recovery block 105, and specifically the fine timing recovery block 138, may be used to adjust the phase interpolators 514(1)-514(N) and thereby compensate for such timing mismatches to ensure that the sample-and-hold blocks 522(1)-522(N) sample at desired time intervals with respect to one another, e.g., 100 ps.

Further with regard to FIG. 5b, and as may be appreciated from the above, description, the coarse programmable gain amplifier (PGA) controller 132 may be configured to characterize the output digital signal of each of the analog-to-digital converters 120(1)-120(N) and to output a coarse gain control signal based thereon. The coarse programmable gain amplifier 130 may be configured to receive the coarse gain control signal and configured to amplify the input analog signal 304 based thereon and output an amplified signal to the splitter 134, e.g., to the sample-and-hold circuits 522(1)-522(N), in order to divide the amplified signal into a plurality of amplified signals.

The fine PGA controller 134 may be configured to determine a fine gain adjustment for each of the plurality of interleaved analog-to-digital converters 120(1)-120(N), and configured to output a fine gain control signal for each of the corresponding plurality of analog-to-digital converters, based thereon. The fine programmable gain amplifiers (116(1)-116(N), each corresponding to one of the plurality of interleaved analog-to-digital converters 120(1)-120(N), as shown, may thus receive one of the plurality of amplified signals from a corresponding sample-and-hold block, as well as a fine gain control signal (shown in FIG. 5b as going to fine PGA 116(1), although it will be appreciated that each fine PGA 116 may receive an individualized fine PGA control signal, as described herein), so as to output an individually-amplified signal to a corresponding one of the interleaved analog-to-digital converters.

The coarse PGA controller 132, which may be a digital controller, may be configured to characterize the output digital signal of each of the analog digital converters 120(1)-120(N) by taking an average value thereof to determine the coarse gain control signal. In some implementations, the coarse PGA may have a certain dynamic range that is relatively wide compared to a dynamic range of each of the fine PGAs (116(1)-116(N)). For example, the coarse PGA may have a dynamic range of 60 mV-700 mV peak-to-peak, while the fine PGA(s) may have a dynamic range that is smaller by a factor of ten or more. In this way, the coarse PGA 130 may handle a wide range for the received signal 304, while smaller, lower-power amplifiers may be used for the fine PGAs (thereby reducing an overall power consumption). For example, a threshold voltage for the received signal 304 may be set to a midpoint of the available range (e.g., approximately 360 mV in the above example). Then, when an average voltage at the outputs of the ADCs is higher or lower than the desired output level of the coarse PGA 130, the coarse PGA controller 132 may raise or lower a gain of the coarse PGA accordingly to maintain the coarse PGA output at the desired level. In other implementations, the coarse PGA 130 (and coarse PGA controller 132) may be removed and both coarse and fine gain control may be performed at the fine PGAs 116(1)-116(N). In these implementations, a wider dynamic range may be required for each of the fine PGAs, which may result in higher power being consumed.

The fine PGA controller 134 may be a digital controller that is configured to determine a first analog-to-digital converter (e.g., ADC 120(1)) as having a reference fine gain adjustment of zero, and is configured to determine remaining ones of the fine gain adjustments relative to the reference fine gain adjustment. In this way, gain mismatches between the ADCs 120(1)-120(N), which may be due to various process or temperature effects during fabrication of the ADCs 120(1)-120(N), may be reduced or eliminated, and outputs of each of the ADCs 120(1)-120(N) may be maintained at substantially the same level. In other examples, the reference fine gain may be determined with respect to the average gain value, and then the fine gain adjustment for each fine PGA/ADC may be made with respect thereto.

Similarly to the fine timing recovery (phase control) described above, it may be appreciated that to the extent that the fine gain control is necessitated by the referenced fabrication artifacts, such effects are generally time-invariant. Consequently, once the fine PGA controller 134 calculates the various gain offsets for the PGAs 116(1)-116(N), these gain offsets may be frozen, e.g., maintained in a register or other memory, so that the calculations need not be performed again, or may be performed less frequently. Such freezing also may reduce or eliminate small gain changes that may be associated with quantization effects of having digitized the fine PGA control signal, whereby the desired gain may be between two quantized/digitized levels and may oscillate therebetween.

Figure 5C:
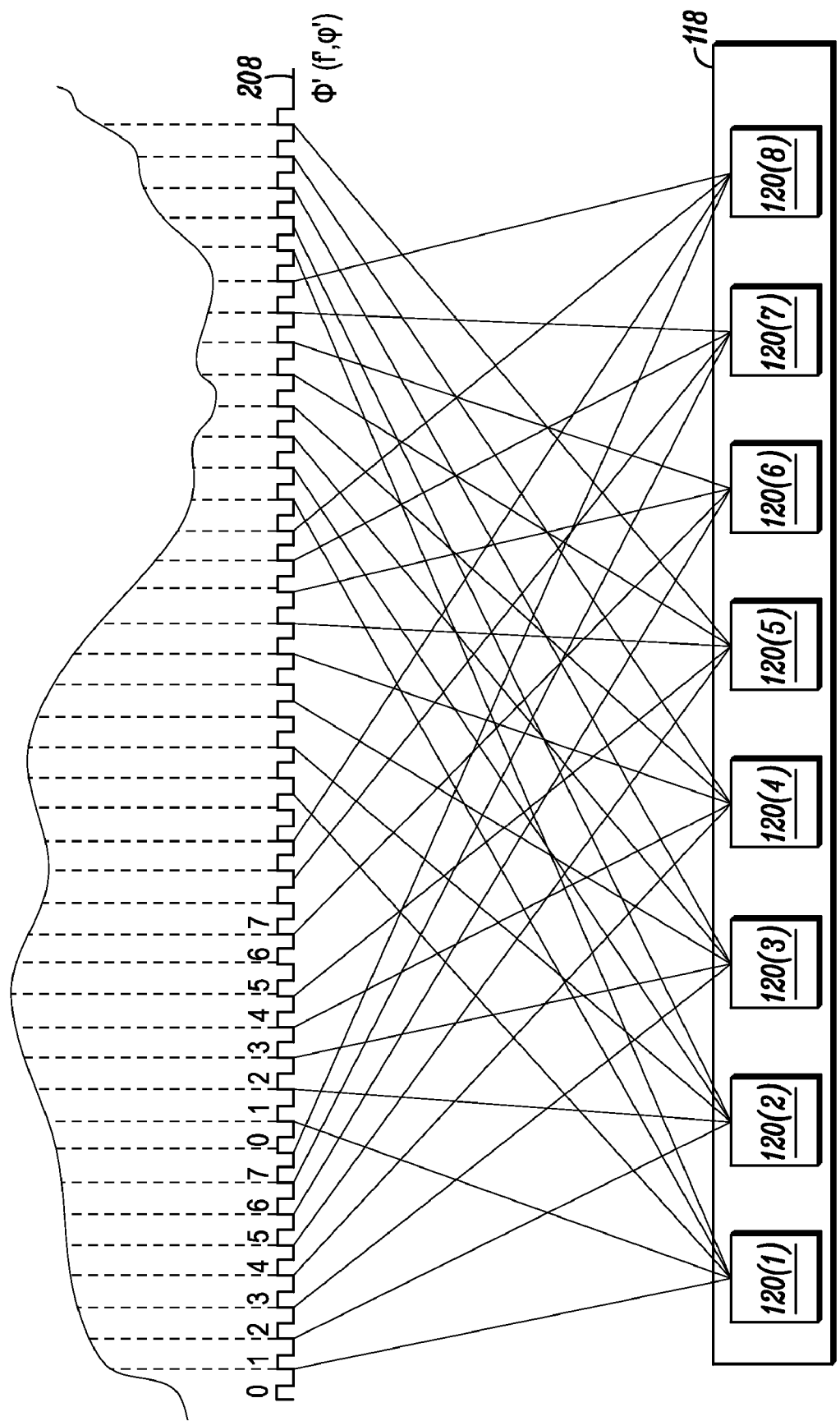
FIG. 5c depicts an overall operation of an interleaved ADC according to one embodiment.

FIG. 5c depicts an overall operation of an interleaved ADC according to one embodiment. As described above, an interleaved ADC 118 may include a plurality of ADCs 120(1)-120(n). Each ADC 120(1)-120(n), may be triggered by a receiver clock 208 on a particular cycle. The effective rate of the receiver clock 208 may be the baud rate of the transmitted signal. However, the clock rate of a particular ADC 120(1)-120(n) may be significantly lower than the baud rate.

Figure 6A:
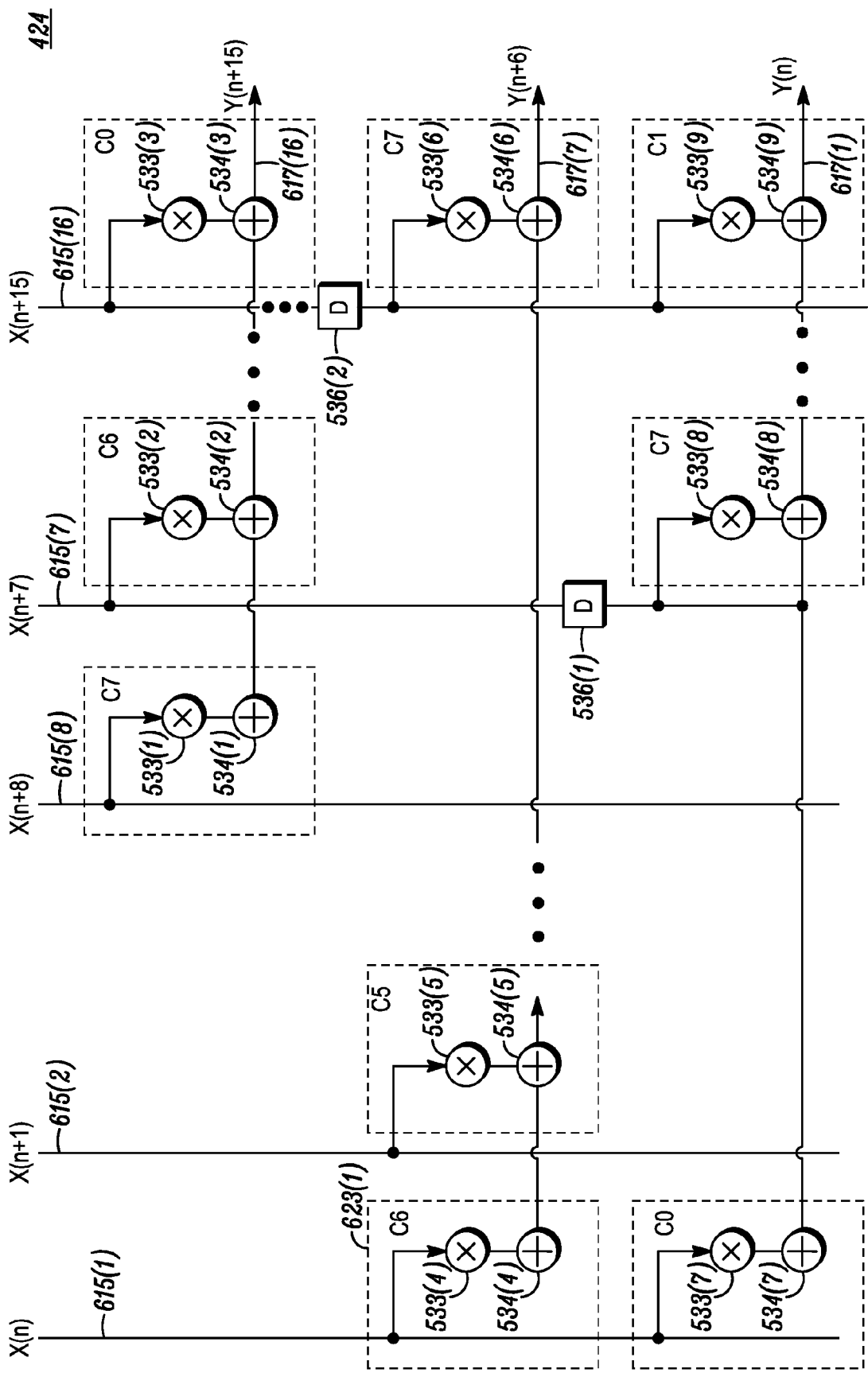
FIG. 6a depicts a signal path for an interleaved FFE.

FIG. 6a depicts a signal path for an interleaved FFE. According to one embodiment the interleaved FFE may utilize a parallel structure for receiving 16 input signals X(n)-X(n+15) and generating 16 output signals Y(n)-Y(n+15). This is merely exemplary, and an interleaved ADC may include any number of input signals and any number of output signals. A serial FFE with, for example, 8 taps may be implemented as a convolution of an input signal with an FIR.

$$y(n) = \sum_{i=0}^{7} c(i)x(n-i)$$

According to one embodiment, an interleaved FFE 118 generates 16 outputs y(n)-y(n+15) as a function of 16 inputs x(n)-x(n+15) according to the following relationships.

$y(n)=c(0)x(n)+c(1)x(n-2)+c(2)x(n-2)+c3x(n-3)+\ldots+c(7)x(n-7)$ $y(n+1)=c(0)x(n+1)+c(1)x(n)+c2x(n-1)+c3x(n-2)+\ldots+c(6)x(n-6)$ $y(n+15)=c(0)x(n+15)+c(1)x(n+14)+c2x(n+13)+c3x(n+12)+\ldots+c(7)x(n+8)$ Referring to FIG. 6a, an interleaved FFE 424 may received a plurality of inputs x(n)-x(n+15) on a plurality of respective input lines 615(1)-615(16). The FFE 424 may generate a plurality of outputs y(n)-y(n+15) on a plurality of output lines 617(1)-617(16). Each input line 615(1)-615(16) may include a plurality of multiply and accumulate ("MAC") blocks 623(1)-623(n). Each MAC block 623(1)-623(n) may include a respective multiplication block 533 and summation block 534. Each MAC block 623(1)-623(n) may be coupled to a respective input line 615(1)-615(16) via its multiplication block 533, which provides an input port for the MAC block 623. Each MAC block 623 may be coupled to a different input line 615(1)-615(16) via its respective summation block 534, which serves as an output port for the MAC block 623.

An input (x(n)-x(n+15)) for a particular input line 615(1)-615(16) may be provided to the plurality of MAC blocks coupled to that input line via the MAC block's respective multiplication block 533, where it may be multiplied by a respective coefficient CX and then provided to a respective summation block 534 for that MAC block 623. The output of a respective summation block 534 may be combined with the outputs of other MAC blocks 623 coupled to different input lines.

Figure 6B:
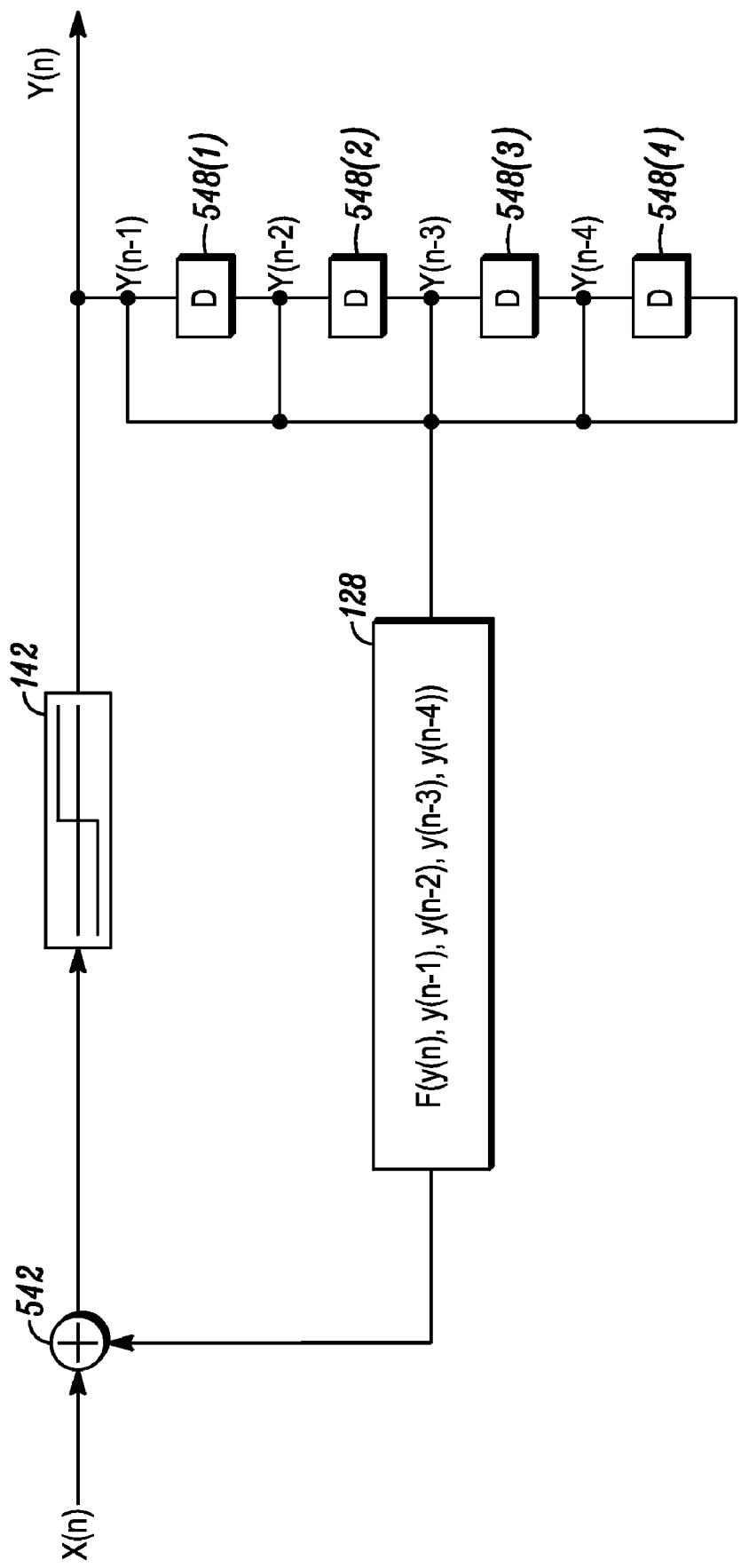
FIG. 6b depicts a serial DFE cell according to one embodiment.

FIG. 6b depicts a serial PDFE cell according to one embodiment. The arrangement shown in FIG. 6b may represent one channel in a parallel array for an interleaved PDFE 428(1), 428(2). An input signal x(n) may be provided to a summation block 542 where it is additively combined with an output from a PDFE cell 128. The output of the summation block 542 may then be provided to a slicer 142, which may generate a binary signal (e.g., +1, −1) depending upon whether the input to the slicer 142 is less than or greater than zero. The output of the slicer 142 may be provided to a plurality of delay elements, for example, 548(1)-548(4), which generate respective delayed signals y(n)-y(n-4). The delayed output signals y(n)-y(n-4) may be provided back to the PDFE element 128, which generates an output signal F(y(n), y(n-1), y(n-2), y(n-3), y(n-4)). The output signal F(y(n), y(n-1), y(n-2), y(n-3), y(n-4)) may be a linear combination of the delayed signals y(n)-y(n-4). According to one embodiment, each binary signal y(n)-y(n-4) may be multiplied by a 16 bit coefficient to generate a 16 bit number. These 16 bit values may then be combined in a linear relationship via the PDFE element 128.

Figure 7A:
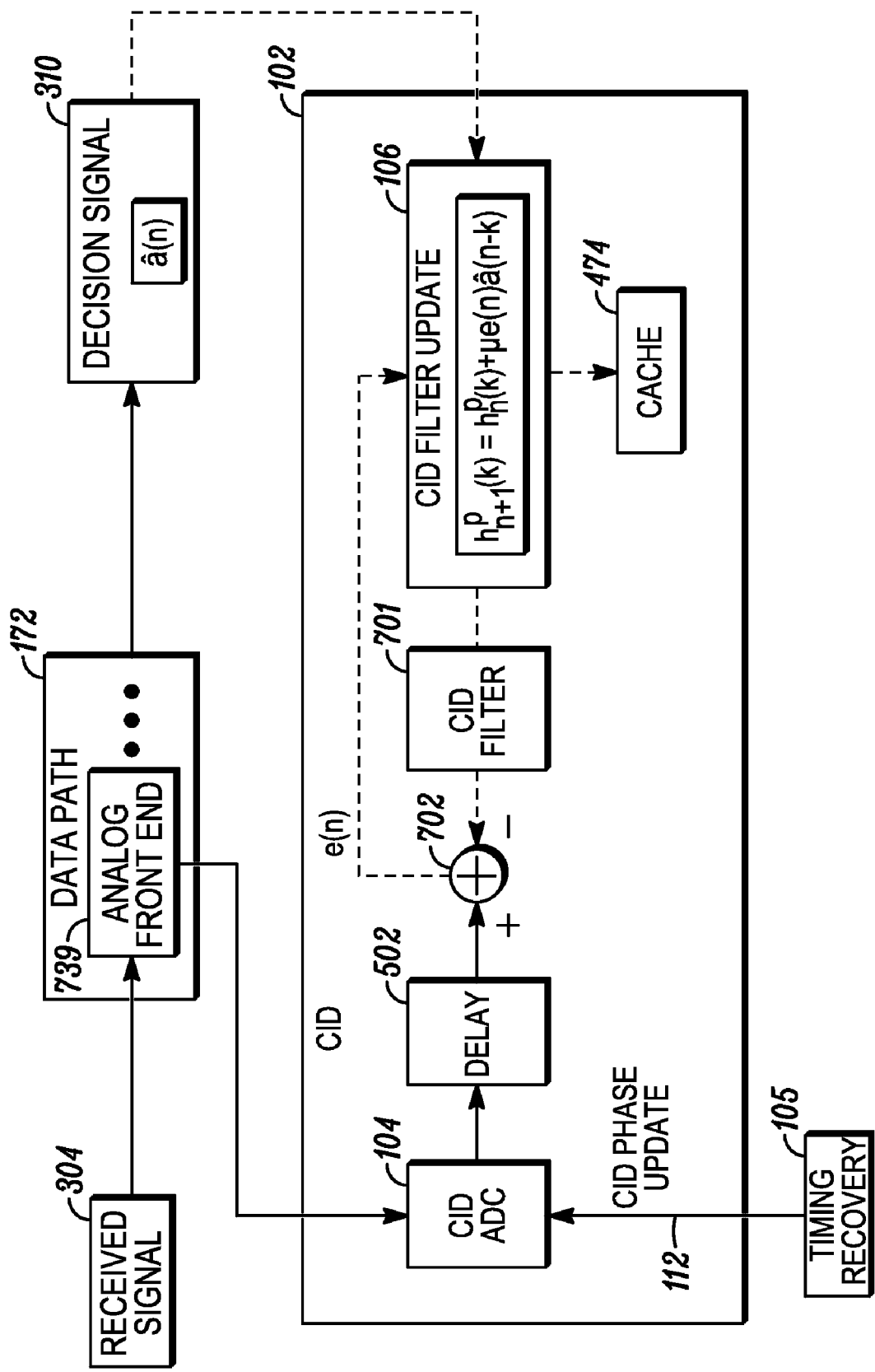
FIG. 7a depicts an operation of a channel identification filter update block according to one embodiment.
Figure 7B:
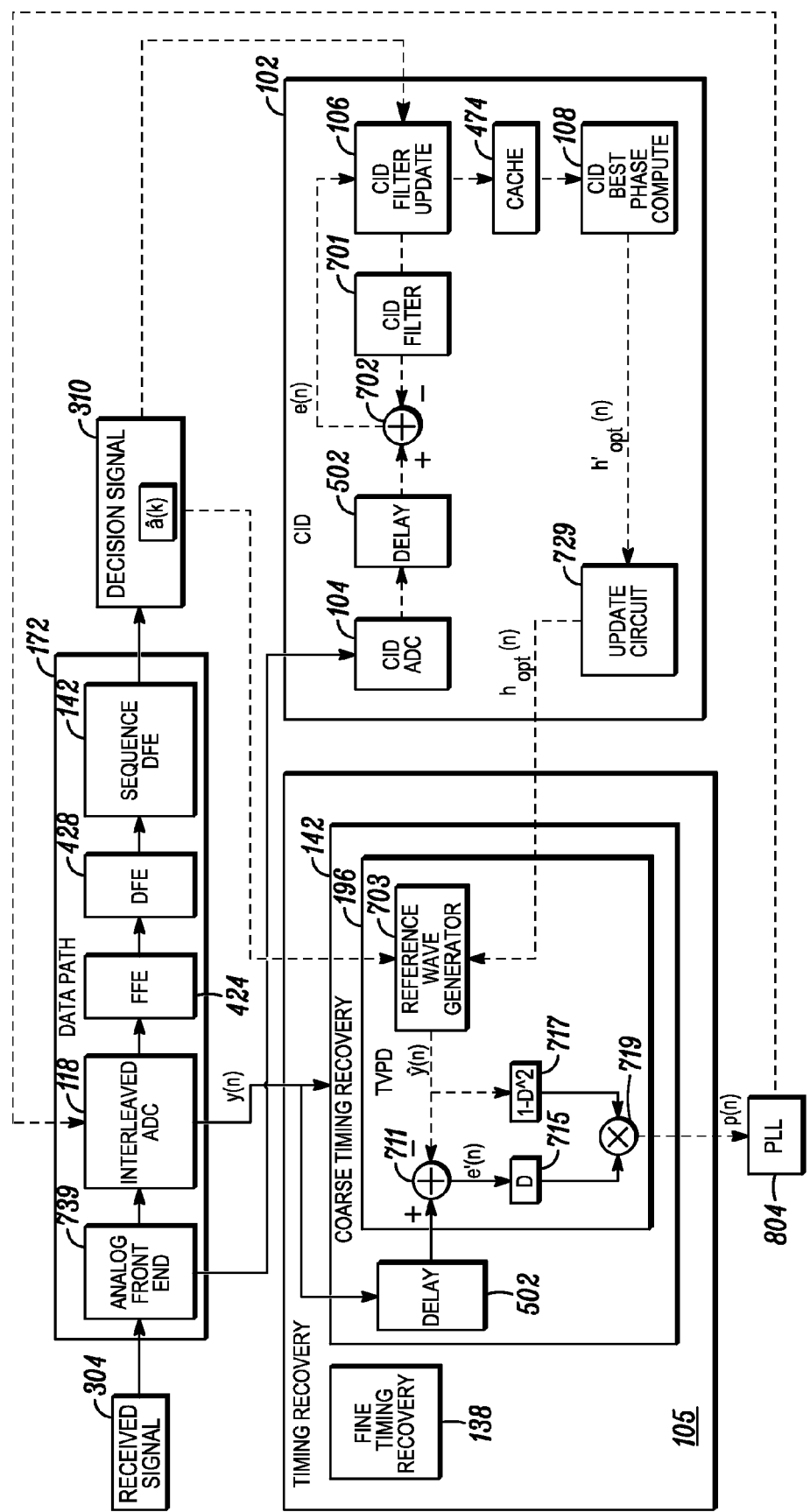
FIG. 7b depicts an operation of a channel identification block to determine channel characteristic information for assisting a timing recovery operation according to one embodiment.

FIG. 7a depicts a partial operation of a CID filter update block 106 according to one embodiment. A more detailed example of a timing recovery and channel identification operation(s) is provided below, with respect to FIGS. 7b and 7c. In FIG. 7a, the CID filter update block 106 may be included within a TVPD 196 or CID 102 and may perform an update of an estimated channel characteristic for a communication channel 182. As noted above, the channel characteristic may be an impulse response for the communication channel 182. The CID filter update block 106 may calculate a plurality of channel characteristics for a plurality of different sampling phases for the communication channel 182. Thus, for example, in the case where the channel characteristic is an impulse response, the CID filter update may compute a plurality of estimated channel impulse responses parameterized by a phase parameter (p) and an iteration parameter (n), $h_n^P(k)$. As described below, a CID best phase compute block 108 may compute a best phase channel characteristic from the plurality of channel characteristics, which may be utilized to provide a timing recovery assist signal to a timing recovery block 105 to assist in timing recovery (not shown in FIG. 7).

The CID filter update block 106 may update a next iteration of the estimated channel impulse response for a given phase $h_{n+1}^P(k)$ by computing an error signal e(n). The error signal e(n) may be computed by taking a difference between the sampled received signal 304 and the decision signal â(n) 310 after processing by the CID filter 701. For example, the CID filter update block 106 may provides coefficients "h" for each phase $h_{n+1}^P(k)$ to the CID filter 701, for generation thereby of a waveform for comparison to the delayed output of the CID ADC 104, as shown, and subsequent determination of e(n).

Referring again to FIG. 7a, a received signal 304 may be provided to a data path 172 (described above with respect to FIGS. 3a, 3b and 4). After processing via the data path 172, a decision signal â(n) 310 may be rendered. As noted above with respect to FIG. 4, the data path 172 may render a plurality of decision signals, wherein only a subset of the decision signals are selected for routing to a CID block 102, for example via a multiplexer or router. This may be possible due to the fact that the CID block may operate at a lower clock rate than the baud rate. The decision signal(s) 310 may then be provided to a CID filter update block 106 at a CID block 102.

As shown in FIG. 7a, the received signal 304 may also be provided to a CID ADC 104, which performs analog to digital conversion on the received signal. The CID ADC 104 may operate at a clock rate sufficient to perform tracking of the time varying nature of a channel characteristic. According to one embodiment, for example, the CID ADC 104 may operate at 10 MHz. The timing recovery block 105 may provide a CID phase update signal 112 to the CID ADC 104 to control the sampling phase of the CID ADC 104. The timing recovery block 105 may update the CID phase update signal 112 on a periodic basis. According to one embodiment, the CID block 102 may compute estimated channel impulse responses for 16 different phases $h_{n+1}^P(k)$.

After sampling by the CID ADC 104, a sampled version of the received signal may be provided to a delay block 502. The delay block may be necessary to compensate for delay of the received signal 304 through the data path 172. The delayed version of the sampled version the received signal 304 may then be provided to a summation block 702, which may compute the difference of the sampled and delayed received signal 304 and the output of the CID filter 701 to generate an error signal e(n). The error signal e(n) may then be provided to the CID filter update block 106 for processing a subsequent iteration of the estimated channel impulse response.

According to one embodiment, the CID filter update block 106 may calculate a next iteration $h_{n+1}^P(k)$ of the estimated channel impulse response utilizing the decision signal â(n), the error signal e(n), a previous iteration of the estimated channel impulse response $h_n^P(k)$ and a parameter μ. According to one embodiment the CID filter update block 106 may compute a next iteration of the estimated channel impulse response utilizing the relation:

$$h_{n+1}^P(k) = h_n^P(k) + \mu e(n)\hat{a}(n-k)$$

FIG. 7b depicts an operation of a CID block to determine channel characteristic information for assisting a timing recovery operation according to one embodiment. In general, the optimal estimated impulse response $h_{opt}(n)$ and the decision signal may be utilized by a reference wave generator 703 to regenerate an estimate of the received signal y(n) which may serve as a timing recovery assist signal ŷ(n). The timing recovery assist signal ŷ(n) 312 may be provided to assist in a timing recovery operation. In particular, the coarse timing recovery block 142 in the timing recovery block 105 may receive the timing recovery assist signal y(n) 312 and utilize the timing recovery assist signal 312 in a Mueller-Muller algorithm to perform timing recovery operations such that a phase signal p(n) is generated to drive a PLL 804 controlling a sampling phase of an interleaved ADC 118.

Although FIG. 7b, ascribes particular functional blocks to perform certain functions and/or operations, it will be understood by skilled practitioners that this is merely exemplary. The utilization of a channel characteristic (e.g., an estimated impulse response of a communication channel) to assist and/or perform timing recovery operations for a communication system may be performed by a single functional unit or multiple function units. Furthermore, the operations ascribed to the TVPD 196 may be performed in fact by a CID block 102 rather than by a timing recovery block 105. As another example, the CID filter 701 may be performed by the same or similar block as the reference wave generatore 703.

According to an exemplary embodiment, a CID block 102 may in include a CID ADC 104, a delay 502, a summation block 702, a CID filter update block 106, a cache 474 and an update circuit 729. A received signal 304 is provided to a data path 172 including an analog front end 739, an interleaved ADC 118, an FFE 424, a DFE 428 and a sequence DFE 142 in a signal processing system 140. The analog front end 739 may perform analog processing on the received signal 304 including amplitude adjustment of the received signal. The output of the analog front end 739 may be provided to a CID ADC 104 in the CID 102. The CID ADC 104 may perform analog to digital conversion of the output of the analog front end 739. The CID ADC 104 may operate at a data rate significantly lower than the baud rate.

The output of the analog front end 739 may also be provided to an interleaved ADC 118, followed by an interleaved FFE 424, an interleaved DFE 429 and a sequence DFE 142. The sequence DFE 142 may output a decision signal 310, which may be provided to a CID filter update block 106 in the CID 102 and the reference wave generator 703. The operation of a CID filter update block 106 has already been described with respect to FIG. 7a. That is, after analog to digital conversion is completed by CID ADC 104, the output of the CID ADC 104 may be provided to a delay 502. The output of delay 502 may be provided to a summation block 702 where a difference signal (e(n)) is computed with the output of the CID filter update block 106, which may then be provided back to the CID filter update block 106 and thus to the CID filter 701.

The CID 102 may also include a cache 474. The updated estimated channel impulse responses as calculated by the CID filter update block 106 may be provided to and stored in the cache 474. As described in more detail below, the cached estimated channel responses parameterized by a phase parameter (p) may be analyzed periodically by a best phase compute block 108, which may compute an optimal estimated channel impulse response (i.e., best phase) utilizing a predefined metric.

The optimal estimated channel impulse response ($h'_{opt}(n)$) may be provided to the update circuit 729 (described in detail below with respect to FIG. 7c), and thus to the reference wave generator 703 within the TVPD 196, as shown. The TVPD 196 may thus utilize the optimal estimated channel impulse response $h_{opt}(n)$ to perform a TVPD operation in order to generate a timing recovery assist signal ($\hat{y}(n)$) 312, which it may provide to assist in timing recovery operations. In particular, the TVPD 196 also may receive the decision signal 310 and may utilize the decision signal 310 to generate a reconstructed or regenerated version of the received signal y(n) using the current estimated optimal impulse response $h_{opt}(n)$. The regenerated version of the receive signal $\hat{y}(n)$ may serve as a timing recovery assist signal that may be provided to a timing recovery block 105 to be used for a timing recovery operation. According to one embodiment, the timing recovery assist signal $\hat{y}(n)$ 312 may be computed as a convolution of the current optimal estimated impulse response $h_{opt}(n)$ and the decision signal 310 according to:

$$\hat{y}(n) = \sum_j h_{opt}(j)\hat{a}(n-j)$$

Upon receiving the timing recovery assist signal 310, the timing recovery block 105 may perform a timing recovery operation utilizing the Mueller-Muller algorithm. In particular, the timing recovery block 105 may compute a slope of the regenerated waveform $\hat{y}(n)$ and multiply this slope with the error between the actual data received by a data ADC y(n) and the regenerated waveform $\hat{y}(n)$. In order to perform this operation, the timing recovery block may include a plurality of delay elements to align the actual data signal and the regenerated signals. Referring to FIG. 7b, the timing recovery block 105 may include a coarse timing recovery block 142. The coarse timing recovery block 142 may generate a phase signal p(n) for controlling the overall sampling phase of the ADCs comprising the interleaved ADC 118 (described in detail below).

The coarse timing recovery block may include a delay block 502, a summation block 711, a first delay element 715, a second delay element 717 and a multiplication block 719. At least one output from the plurality of ADCs comprising the interleaved ADC 118 may be provided to a delay 502 in the coarse timing recovery block 142 in order that it may be aligned with the reconstructed signal $\hat{y}(n)$. The output of the delay 502 may be provided to a summation block 711 where it is combined with the timing recovery assist signal $\hat{y}(n)$ 312 to produce a difference signal e'(n). The difference signal e'(n) may be computed as:

$$e'(n) = y(n-k) - \hat{y}(n)$$

The difference signal e'(n) may be provided to a delay element 715, which generates a one sample delayed version of the error signal e(n−1), which may be provided to a multiplication block 719. The timing recovery assist signal $\hat{y}(n)$ 312, may also be provided to a second delay element 717, which may generate a copy of the timing recovery assist signal $\hat{y}(n)$ 312 and a delayed version of the timing recovery assist signal $\hat{y}(n)$ 312 delayed by two samples. The outputs of the first and second delay elements 715 and 717 may be provided to a multiplication block 719, which multiples the two signals to generate a phase signal p(n) as output. Thus, the phase signal p(n) may be computed as the multiplication of the error signal e'n and the slope of the (regenerated) waveform.

$$p(n) = e'(n) * [\hat{y}(n-1) - \hat{y}(n+1)]$$

In other words, it may be understood from the above explanation that $\hat{y}(n)$ represents the convolution of the computed impulse response to the decision of the DFE (or sequence DFE), and thus the expected value of y(n) assuming the impulse response is valid. Consequently the error signal e'(n) multiplied by the slope of the regenerated waveform $\hat{y}(n)$ as represented by $[\hat{y}(n-1) - \hat{y}(n+1)]$, and according to the Mueller Muller algorithm, results in the phase signal p(n). The phase signal p(n) may be provided to a PLL 804, which is utilized to control the sampling phase of the interleaved ADCs comprising the interleaved ADC block 118.

Figure 7C:
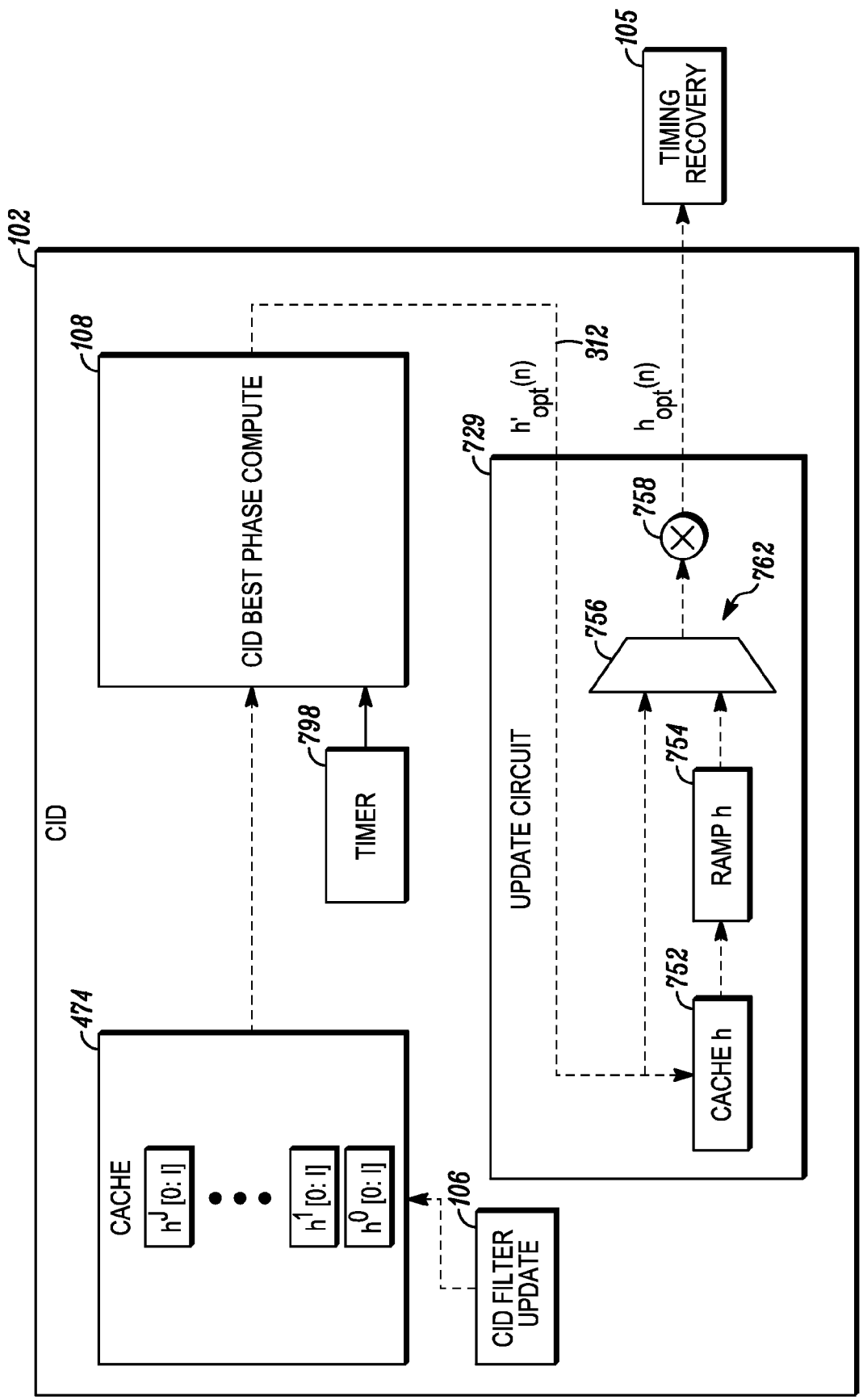
FIG. 7c depicts an operation of a best phase compute block according to one embodiment.

FIG. 7c depicts an operation of a best phase compute block according to one embodiment. The best phase compute block 108 may be included within a CID block 102 and may determine an optimal estimated impulse channel characteristic $h'_{opt}(n)$ 312 for a plurality of channel characteristics parameterized by a phase. As noted previously, a CID filter update block 106 may store in a cache 474 a plurality of estimated impulse responses $h^0[0:I] - h^i[0:I]$, each of which may be parameterized by a distinct phase from 0-i. According to one embodiment, each estimated impulse response $h^0[0:I] - h^i[0:I]$ stored in the cache may be associated with a plurality of taps, for example i may be 6.

On a periodic basis, a CID best phase compute block 108 may determine an optimal impulse response $h'_{opt}(n)$ from among the plurality of impulse responses $h^0[0:I] - h^i[0:I]$ each associated with a respective phase and stored in cache 474. The CID best phase compute block 108 may attempt to minimize or maximize a particular metric to determine $h'_{opt}(n)$. That is, on a periodic basis the CID best phase compute block 108 may apply a metric to the plurality of impulse response signals $h^0[0:I] - h^i[0:I]$ stored in the cache 474. For example, the CID may include a timer 798. Upon the running of the timer 798, a signal may be sent to the CID best phase compute block 108 to cause the determination of $h'_{opt}(n)$ from $h^0[0:I] - h^i[0:I]$. Upon determination of $h'_{opt}(n)$, the timer may be reset and the process re-initiated. According to one embodiment, the CID best phase compute block 108 utilizes a metric to minimize the ISI energy of the estimated channel impulse response signals relative to a main tap. For example, according to one embodiment the metric to be maximized is (where the first term h(3) is for a main tap and other terms are ISI terms):

$$[h^p(3)]^2 - [h^p(2)]^2 - [h^p(1)]^2 - [h^p(0)]^2 - [h^p(4)]^2 - [h^p(5)]^2$$

Upon determination of $h'_{opt}(n)$ 312, for example, utilizing the minimum ISI energy metric described above, $h'_{opt}(n)$ may be provided to a TVPD 196 for utilization in a timing recovery assist operation (i.e., to generate a phase signal p(n)) in conjunction with a timing recovery block 105. However, according to one embodiment, before $h'_{opt}(n)$ is provided to the TVPD 196, $h_{opt}(n)$ may be processed by an update circuit 729. It may be desirable because of tracking errors not to update the phase of the TVPD 196 too rapidly. The update circuit 729 may function to cause a slow updating of the $h'_{opt}(n)$ provided to the TVPD 196, where the updated parameter that is provided is shown herein as $h'_{opt}(n)$.

The update circuit 729 may include a cache 752, a ramp circuit 754, a multiplexer 756 and a multiplication block 758. $h'_{opt}(n)$ may be provided to a cache 752 which stores a plurality of $h'_{opt}(n)$'s as they are provided by the CID best phase compute block 108. A threshold circuit 756 may at each clocking instant determine difference between the current best phase h'$_{opt}$(n) and the h$_{opt}$(n) stored in the cache 752. In particular, the update circuit may function only when the change in h'$_{opt}$(n) exceeds a certain programmable threshold so as to update the cache This error may be divided by a large value and the divided value may slowly update the h$_{opt}$(n)'s provide into the TVPD 196.

Figure 8:
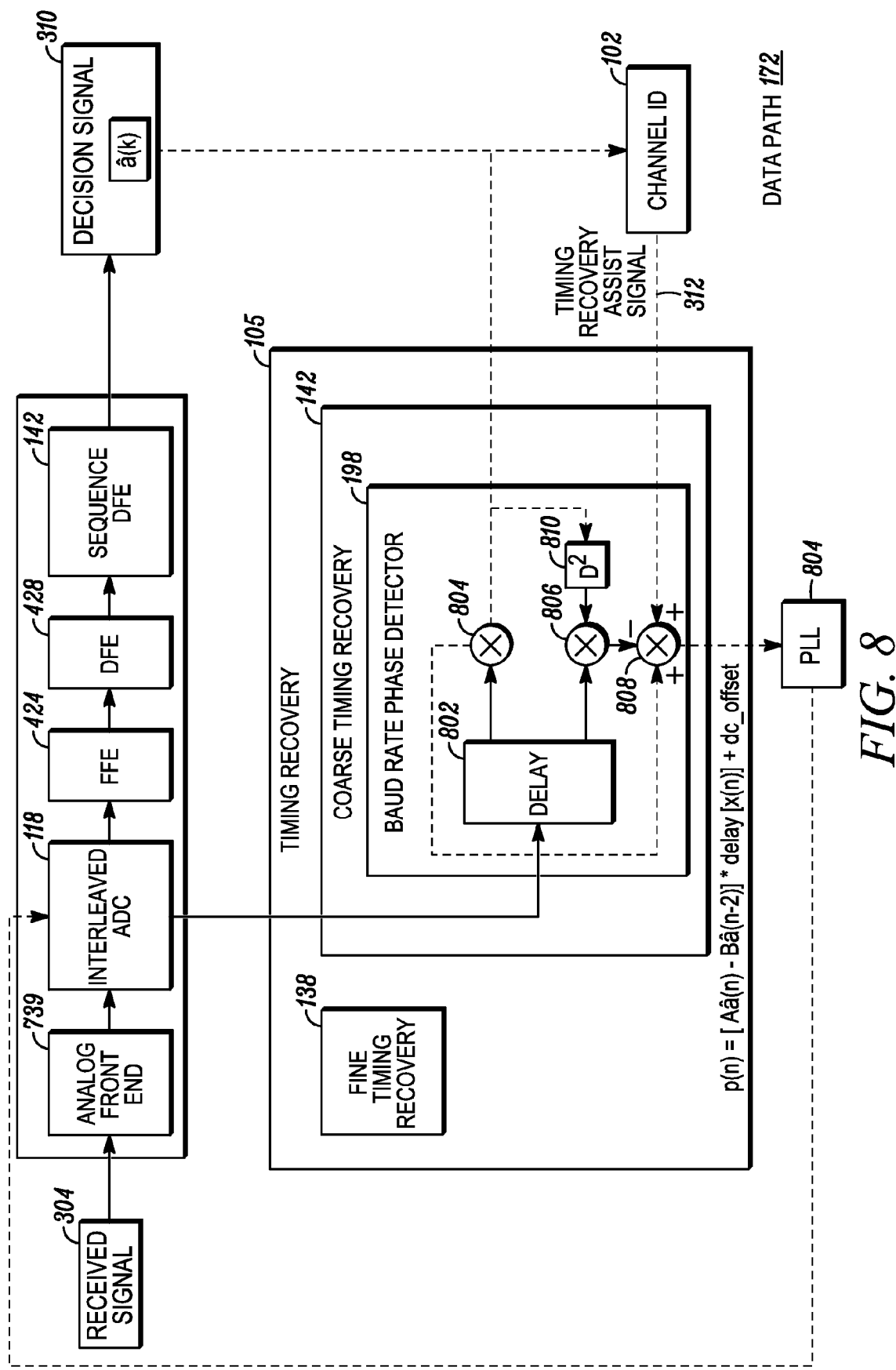
FIG. 8 depicts an operation of a baud rate phase detector.

FIG. 8 depicts an operation of a baud rate phase detector. The signal path shown in FIG. 8 may be operative before an estimated channel impulse response has been determined by the CID 102 (i.e., when the signal processing system 140 is in a startup mode). As shown in FIG. 8, a timing recovery block 105 may include a coarse timing recovery block 142 and a fine timing recovery block 138. The coarse timing recovery block 142 may include a baud rate phase detector 198. The baud rate phase detector may include a delay 802, a first multiplication block 804, a second multiplication block 806, a delay element 810 and a summation block 808.

A received signal 304 may be provided to data path 172 that includes an analog front end 739, an interleaved ADC 118, an interleaved FFE 424, an interleaved DFE 428 and a sequence DFE 142. The received signal 304 may be provided to an analog front end 739, which performs analog signal processing on the received signal. The processed output of the analog front end 739 may then be provided to an interleaved ADC 118, which may perform analog to digital conversion on the processed analog signal. The output of the interleaved ADC 118 may be provided to an interleaved FFE 424. The output of the interleaved FFE 424 may be provided to an interleaved DFE 428. The output of the interleaved DFE 428 may be provided to a sequence DFE 142. The sequence DFE 142 may generate a decision signal â(k) 310. The decision signal â(k) 310 may also be provided to a channel ID block 102, which may generate a timing recovery assist signal 312 herein referred to as the dc_offset signal (that is, the assist signal 312 in start-up mode, which includes at least a dc_offset value).

At least one digital output of the interleaved ADC 118 may be provided to a delay 802 in the baud rate phase detector 198. The decision signal â(k) 310 generated by the sequence DFE 142 may be provided to a first multiplication block 804 and a delay element 810 in the baud rate phase detector 198. The output of the delay 802 may also be provided to the first multiplication element 804, where it is multiplied by the decision signal â(k) 310. Delay element 810 may generate a two sample delayed version of the decision signal â(k) 310, which it may provide to a second multiplication block 806, where the delayed decision signal â(k) 310 may be multiplied by the output of the delay 802. The output of the second multiplication block may then be provided to the summation block 806 where it is combined with the timing recovery assist signal 312 (dc_offset) provided by the channel ID.

The summation block 808 may generate a phase signal p(n) by combining the output of the first multiplication block 804, the second multiplication block 806 utilizing the following relation, where A & B are scalar constants, where this relation may be referred to herein as the dc phase detector relation:

$$p(n)=[A\hat{a}(n)-B\hat{a}(n-2)]*\text{delay}[x(n)]+dc\_\text{offset}$$

Figure 9:
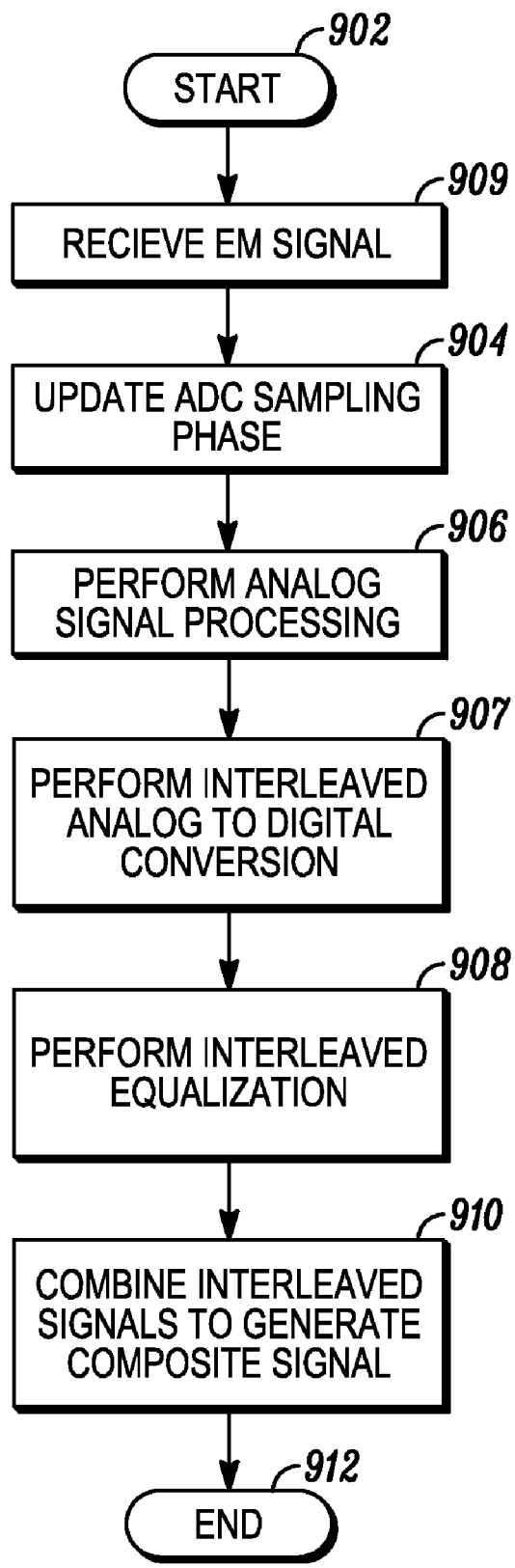
FIG. 9 is a flowchart depicting an operation of a signal processing system according to one embodiment.

FIG. 9 is a flowchart depicting an operation of a signal processing system according to one embodiment. The process is initiated in step 902. In step 909 an electromagnetic signal is received. The electromagnetic signal may be received by a receiver over a communication channel 182. In step 904 a sampling phase of an interleaved ADC may be updated. As described herein, the interleaved ADC may be controlled by a timing recovery operation performed by a baud rate phase detector, a TVPD or a combination thereof.

As previously noted, the phase detectors (TVPD or baud rate) may generate a phase signal p(n), which may be provided to a PLL to control a sampling clock of the interleaved ADC. Although FIG. 9 suggests that this step occurs serially, the update of the ADC sampling phase 904 may be occurring in parallel with the other steps depicted in FIG. 9.

In step 906, analog signal processing may be performed on the received signal. According to one embodiment, the analog signal processing may comprise variable gain amplification or other processing. In step 907, analog to digital conversion may be performed on the processed analog signal. According to one embodiment, the analog to digital conversion may be performed in an interleaved fashion using an interleaved ADC. In step 908, digital equalization may be performed on the output of the ADC. According to one embodiment, the equalization may be performed in an interleaved manner using an interleaved equalizer block. According to one embodiment, the interleaved equalizer may include an interleaved FFE, an interleaved DFE and a sequence DFE. In step 910, the interleaved signals provided by the interleaved structures (ADC and equalizers) may be combined to generate a composite signal. The process ends in step 912.

Figure 10:
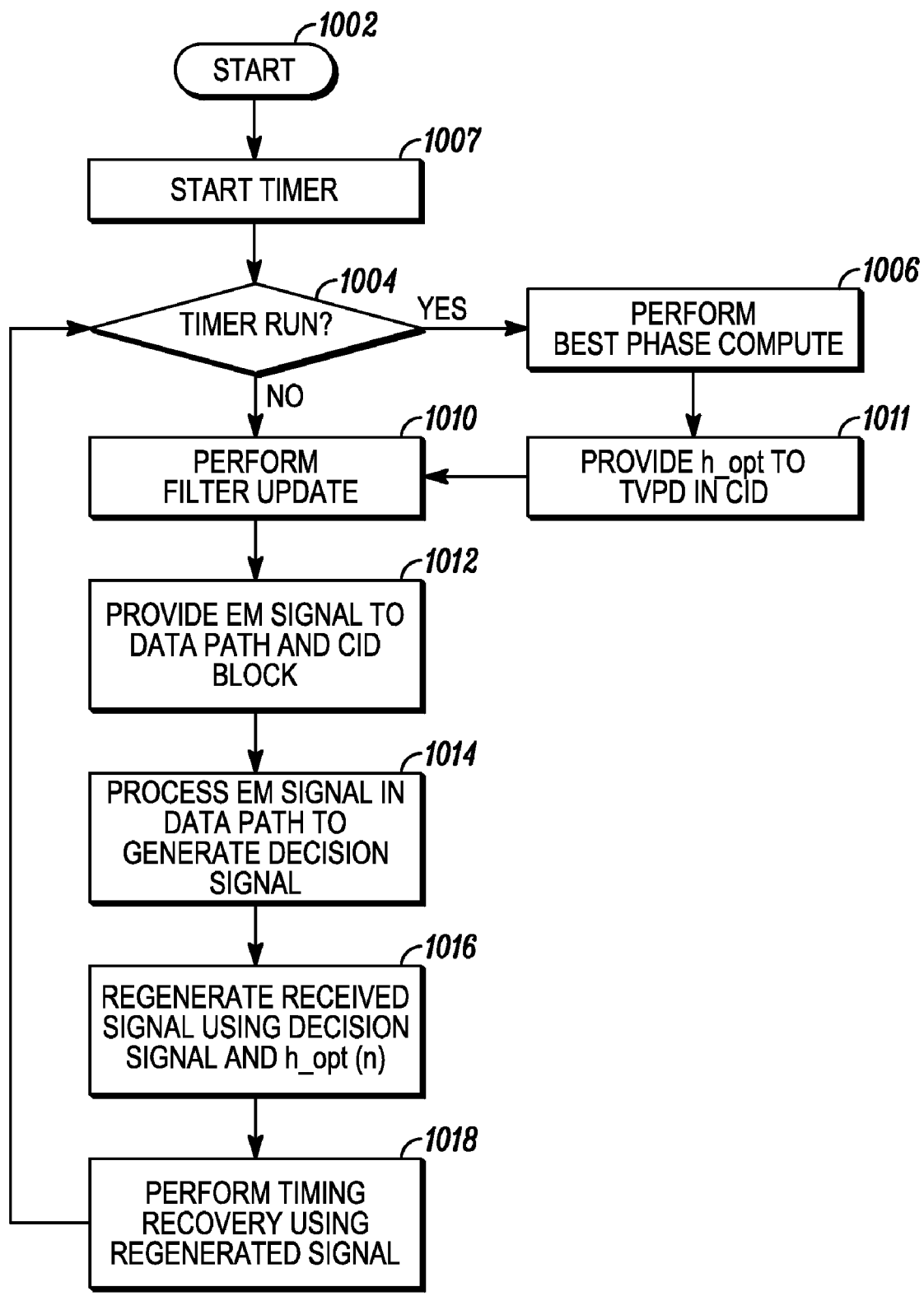
FIG. 10 is a flowchart of an operation performed by a signal processing system according to one embodiment.

FIG. 10 is a flowchart of an operation performed by a signal processing system according to one embodiment. The process shown in FIG. 10 may be executed during a steady state operation of the signal processing system (i.e., after startup operations have been completed). Thus, it is assumed that h_opt(n) has been determined and the system has settled (i.e., the filter routines have converged). The process is initiated in step 1002. In 1007, a timer may be initialized. In 1004, a test is performed to determine whether the timer has run. If not ('no' branch of 1004), in 1010 a filter update is performed. The filter update may be a routine to estimate of an impulse response of a communication channel.

In 1012, a received signal 304 may be provided to both a data path and a CID block of the signal processing system 140. In 1014, the EM signal may be processed by the data path to generate a decision signal 310. In step 1016, a regenerated signal ŷ(n) may be generated using the decision signal 310 to determine the optimal impulse response for the communication channel h_opt(n). According to one embodiment, the regenerated signal may be generated via a TVPD. In 1018, a timing recovery operation may be performed using the regenerated signal ŷ(n). According to one embodiment, the timing recovery operation may utilize a variant of the Mueller-Muller algorithm. Flow then continues with 1004.

If the timer has run ('yes' branch of 1004), in 1006 a best phase compute operation may be performed. The best phase compute operation may determine an optimal estimated impulse response for a communication channel using a predefined metric. In 1011, the optimal estimated impulse response may be provided to a TVPD. Flow then continues with 1012.

Figure 11:
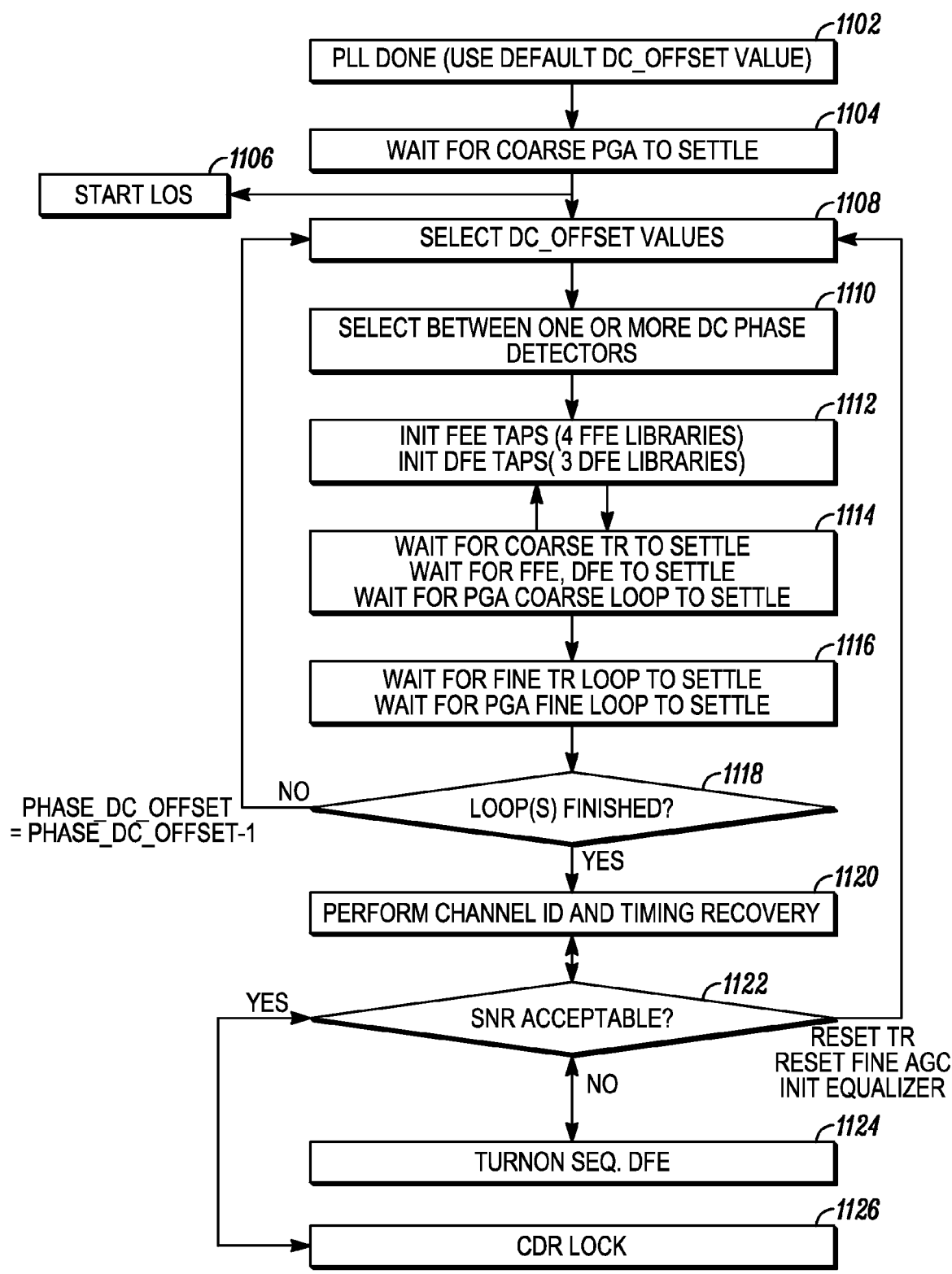
FIG. 11 is a flowchart of an operation performed by a startup state machine of one embodiment.

FIG. 11 is a flowchart of an operation performed by a start-up state machine of one embodiment, such as the start-up state machine 126 of FIG. 1. In general FIG. 11 describes techniques for starting, executing, or otherwise managing a state of the EDC system 140 of FIG. 1. As such, FIG. 11 is intended to provide a description of the start-up state machine 126 of FIG. 1, but does not provide an exhaustive or comprehensive description. For example, conventional functions or techniques of a start-up state machine may be performed by the start-up state machine 126 that are not described here in detail. For example, a number of registers and timers, not shown or described explicitly with respect to FIG. 11, may be maintained that may be used to store and control the various states of the EDC system 140. Further, the start-up state machine 126 may implement some or all of the functionality described above with respect to FIGS. 1-10, or comparable functionality, although not all such functionality is necessarily described or referenced with respect to FIG. 11.

In FIG. 11, and generally, the start-up state machine 126 seeks to find optimal settings for the various blocks, including the ADC(s) 120, the equalizer(s) 132, the coarse and fine PGA 132/134, the CID 102, and the timing recovery 105. As such, the start-up state machine 126 may seek to implement a number of known settings, and to select from such settings the appropriate values for obtaining a desired performance of the EDC system 140. Once the desired performance level(s) is reached, then the start-up state machine 126 may be responsible for monitoring this performance level(s) and for re-calibrating or re-starting when necessary to maintain or regain this performance level(s).

Thus, in FIG. 11, in an initial state the PLL 804 may be converged using a default initial value for the dc_offset value (e.g., a value of 1) from the baud rate phase detector 198 (1102). Then the coarse PGA 130 may be allowed to settle (1104), e.g., to settle to a pre-set value that is within an available gain range. A loss of signal (LOS) module (not pictured) may be started (1106), which may be operable to detect a signal loss or absence (e.g., by monitoring the ADC signal relative to reference thresholds).

Next, the dc_offset may be selected (1108) and implemented for three available phase detectors (1110). For example, with reference to FIG. 8, some initial values for dc_offset may be selected, and the baud rate phase detector 198 may be implemented as a dc phase detector, e.g., as one or more of a pre-cursor phase detector, a post-cursor phase detector, and/or a symmetrical phase detector. That is, assumptions about the channel characteristics may be made, and the channel impulse response may be determined accordingly. Then a channel impulse response may be selected that is relatively close to an actual channel impulse response when the timing recovery converges.

In one example, the baud rate phase detector 198 may assume dc_offset values within some range (e.g., −0.5 to 0.5), and may sweep through these values at pre-determined increments. For each incremental value, some or all of the dc phase detectors may be executed, until timing recovery convergence occurs and/or some performance threshold is reached, and/or until all values are exhausted (whereupon an optimal value may be selected). For example, in the de phase detector relation defined above, certain assumptions about the channel characteristic (e.g., as having pre-cursor, post-cursor, or symmetric ISI) may allow one or more terms to be known or assumed, and the phase signal may be calculated accordingly.

In the example of FIG. 11, the equalizer(s) 132 also may be initialized, somewhat analogously, by selected tap values from available libraries of values (1112). With these selected values in place, the coarse TR 142, the FFEs 124(1)-124(n), and the DFEs 128(1)-128(M) may be turned on and allowed to settle according to a pre-set timer value, and the coarse PGA may be allowed to (re-)settle, as well (1114). These operations (112, 1114) may be repeated until acceptable tap values are determined, whereupon the fine TR and fine PGA loops may be turned on and allowed to settle (1116).

In FIG. 11, an outer loop may continue with a next value of the dc_offset (1118), or, if a suitable dc_offset has been determined, then channel ID and timing recovery may commence (1120), e.g., as described above with respect to FIG. 10. If the SNR monitor 498 determines that current SNR values are not acceptable during this operation (1122), then the sequence DFE 142 may be turned on (1124) for additional performance gains. In other implementations, the sequence dfe 142 may be continually turned on. If the performance gains are insufficient to maintain the SNR at acceptable levels, then, re-initialization of the dc phase detector(s), equalizers, and other components may occur (1108-1118). Of course, other metrics besides SNR may additionally or alternatively be monitored in order to determine whether to re-initialize. As long as acceptable SNR levels are maintained, the clock and data recovery (CDR) lock may occur (1126) and CID and timing recovery may continue (1120).

Implementations of the various techniques described herein may be implemented in digital electronic circuitry, or in computer hardware, firmware, software, or in combinations of them. Implementations may be implemented as a computer program product, i.e., a computer program tangibly embodied in an information carrier, e.g., in a machine-readable storage device or in a propagated signal, for execution by, or to control the operation of, data processing apparatus, e.g., a programmable processor, a computer, or multiple computers. A computer program, such as the computer program(s) described above, can be written in any form of programming language, including compiled or interpreted languages, and can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a communication network.

Method steps may be performed by one or more programmable processors executing a computer program to perform functions by operating on input data and generating output. Method steps also may be performed by, and an apparatus may be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. Elements of a computer may include at least one processor for executing instructions and one or more memory devices for storing instructions and data. Generally, a computer also may include, or be operatively coupled to receive data from or transfer data to, or both, one or more mass storage devices for storing data, e.g., magnetic, magneto-optical disks, or optical disks. Information carriers suitable for embodying computer program instructions and data include all forms of non-volatile memory, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory may be supplemented by, or incorporated in special purpose logic circuitry.

While certain features of the described implementations have been illustrated as described herein, many modifications, substitutions, changes and equivalents will now occur to those skilled in the art. It is, therefore, to be understood that the appended claims are intended to cover all such modifications and changes as fall within the true spirit of the embodiments of the invention.

What is claimed is:
1. A system comprising:
 a plurality of interleaved analog-to-digital converters, each associated with a corresponding conversion rate at which an input analog signal is converted to an output digital signal;

a timing recovery module configured to receive the output digital signals and configured to determine a sampling phase, based thereon, the timing recovery module comprising
   a coarse timing recovery module configured to determine a coarse sampling phase associated with all of the analog-to-digital converters, and
   a fine timing recovery module configured to individually determine a fine sampling phase for each of the analog-to-digital converters,
   wherein the timing recovery module is configured to output a plurality of interpolator control signals, each corresponding to one of the plurality of analog-to-digital converters and generated based on the coarse sampling phase and a corresponding fine sampling phase;
a plurality of interpolators corresponding to the plurality of analog-to-digital converters, each configured to receive a corresponding one of the interpolator controller signals and output a corresponding splitter control signal; and
a splitter configured to receive the splitter control signals and configured to sample the input analog signal at an interval determined by the corresponding splitter control signals to thereby output individual analog signals to corresponding analog-to-digital converters.

2. The system of claim 1 wherein the fine timing recovery module is configured to determine the individual fine sampling phases to account for delays imparted to the splitter control signals and associated with driver circuits between the interpolators and the splitter.

3. The system of claim 1 wherein the fine timing recovery module is configured to determine the individual fine sampling phases by adding an offset to the coarse sampling phase.

4. The system of claim 1 wherein the fine timing recovery module is configured to determine the individual fine sampling phases by selecting one of the plurality of interleaved analog-to-digital converters as having a reference sampling phase, and by defining the individual fine sampling phases with respect to the reference sampling phase.

5. The system of claim 1 wherein the fine timing recovery module is configured to determine the individual fine sampling phases by determining an average phase value for the plurality of interleaved analog-to-digital converters as a reference sampling phase, and by defining the individual fine sampling phases with respect to the reference sampling phase.

6. The system of claim 1 wherein the splitter comprises a plurality of sample-and-hold circuits corresponding to the plurality of interpolators and to the plurality of interleaved analog-to-digital converters, each of the sample-and-hold circuits configured to sample the input analog signal in response to a corresponding received splitter control signal.

7. The system of claim 1 wherein the splitter comprises a plurality of sample-and-hold circuits corresponding to the plurality of interpolators and to the plurality of analog-to-digital converters, each of the plurality of sample-and-hold circuits configured to output a sampled signal to a fine programmable gain amplifier configured to individually amplify the received sampled signal for provision thereof to a corresponding one of the plurality of analog-to-digital converters.

8. The system of claim 1 wherein the fine timing recovery module is configured to determine the individual fine sampling phases and configured to freeze corresponding values for the individual fine sampling phases during operation of the analog-to-digital converters.

9. The system of claim 1 wherein the plurality of interpolators are each configured to receive a clock signal having a frequency substantially the same as a desired sampling frequency of each of the plurality of interleaved analog-to-digital converters, and configured to copy the clock signal into a plurality of clock signals, and wherein the interpolator control signals define selected ones of the plurality of clock signals to be output as the splitter control signals.

10. The system of claim 1 wherein the input analog signal has a symbol rate of at least 10 GHz.

11. The system of claim 1 wherein the interval is approximately 100 ps.

12. A method comprising:
receiving a plurality of output signals from a plurality of interleaved analog-to-digital converters;
determining a coarse sampling phase associated with the plurality of interleaved analog-to-digital converters;
determining individual fine sampling phases associated with corresponding ones of the plurality of analog-to-digital converters;
combining the coarse sampling phase with each of the individual fine sampling phases to determine a plurality of combined sampling phases;
providing the combined sampling phases to corresponding sample-and-hold circuits configured to sample an analog input signal in response thereto for outputting to corresponding ones of the interleaved analog-to-digital converters.

13. The method of claim 12, wherein determining the individual fine sampling phases comprises determining the individual fine sampling phases to account for delays associated with driver circuits transmitting the combined sampling phases to the sample-and-hold circuits.

14. The method of claim 12, wherein determining the individual fine sampling phases comprises determining each of the individual fine sampling phases by adding an offset to the coarse sampling phase.

15. The method of claim 12, wherein determining the individual fine sampling phases comprises:
selecting one of the plurality of interleaved analog-to-digital converters as having a reference sampling phase; and
defining the individual fine sampling phases with respect to the reference sampling phase.

16. A timing recovery module comprising:
a coarse timing recovery module configured to receive a plurality of output signals from a plurality of interleaved analog-to-digital converters, and configured to determine a coarse sampling phase associated with the plurality of interleaved analog-to-digital converters; and
a fine timing recovery module configured to determine individual fine sampling phases associated with corresponding ones of the plurality of analog-to-digital converters,
wherein the timing recovery module is configured to combine the coarse sampling phase with each of the fine sampling phases to thereby provide a plurality of interpolator control signals to a corresponding plurality of phase interpolators for outputting thereby of combined sampling phases to a splitter configured to sample an analog input signal at a pre-determined interval, and
wherein the fine timing recovery module is configured to determine the plurality of interpolator control signals based on delays imparted to each of the combined sampling phases by intervening circuitry between the plurality of phase interpolators and the splitter.

17. The timing recovery module of claim 16 wherein the fine timing recovery module is configured to determine the individual fine sampling phases by adding an offset to the coarse sampling phase.

18. The timing recovery module of claim 16 wherein the fine timing recovery module is configured to determine the individual fine sampling phases by selecting one of the plurality of interleaved analog-to-digital converters as having a reference sampling phase, and by defining the individual fine sampling phases with respect to the reference sampling phase.

* * * * *

UNITED STATES PATENT AND TRADEMARK OFFICE
CERTIFICATE OF CORRECTION

| | | |
|---|---|---|
| PATENT NO. | : 7,525,470 B2 | |
| APPLICATION NO. | : 11/845765 | |
| DATED | : April 28, 2009 | |
| INVENTOR(S) | : Vasudevan Parthasarthy et al. | |

It is certified that error appears in the above-identified patent and that said Letters Patent is hereby corrected as shown below:

On the first page, in field (56), under "Other Publications", in column 2, line 5, delete "Hindlaw" and insert -- Hindawi --, therefor.

Signed and Sealed this
First Day of February, 2011

David J. Kappos
*Director of the United States Patent and Trademark Office*